United States Patent
Kim et al.

(10) Patent No.: US 9,711,192 B2
(45) Date of Patent: Jul. 18, 2017

(54) MEMORY DEVICE HAVING DIFFERENT DATA-SIZE ACCESS MODES FOR DIFFERENT POWER MODES

(71) Applicant: SAMSUNG ELECTRONICS CO., LTD., Suwon-si, Gyeonggi-do (KR)

(72) Inventors: Hye-Ran Kim, Hwaseong-si (KR); Tae-Young Oh, Seoul (KR); Seong-Jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/931,291

(22) Filed: Nov. 3, 2015

(65) Prior Publication Data

US 2016/0125920 A1  May 5, 2016

(30) Foreign Application Priority Data

Nov. 3, 2014  (KR) .................. 10-2014-0151220
Jun. 11, 2015  (KR) .................. 10-2015-0082570

(51) Int. Cl.
*G11C 5/14* (2006.01)
*G11C 7/10* (2006.01)
*G11C 8/12* (2006.01)

(52) U.S. Cl.
CPC .......... *G11C 5/147* (2013.01); *G11C 7/1006* (2013.01); *G11C 7/1057* (2013.01); *G11C 7/1084* (2013.01); *G11C 5/148* (2013.01); *G11C 7/1045* (2013.01); *G11C 8/12* (2013.01); *G11C 2207/2227* (2013.01)

(58) Field of Classification Search
CPC ....... G11C 5/147; G11C 5/148; G11C 7/1006; G11C 7/1057; G11C 7/1084; G11C 7/1045; G11C 8/12; G11C 2207/2227

USPC ...................................................... 365/189.05
See application file for complete search history.

(56) References Cited

U.S. PATENT DOCUMENTS

| | | | |
|---|---|---|---|
| 6,249,457 B1 * | 6/2001 | Okamoto | G11C 29/50 365/185.09 |
| 6,971,034 B2 | 11/2005 | Samson et al. | |
| 8,121,237 B2 * | 2/2012 | Stott | G11C 7/1051 365/193 |
| 8,149,644 B2 | 4/2012 | Fujioka et al. | |
| 8,230,239 B2 | 7/2012 | Wang et al. | |
| 8,432,768 B2 | 4/2013 | Ware et al. | |
| 8,514,611 B2 | 8/2013 | Nguyen et al. | |
| 8,670,265 B2 | 3/2014 | Deng | |
| 8,811,095 B2 | 8/2014 | Tsern et al. | |

(Continued)

FOREIGN PATENT DOCUMENTS

| | | |
|---|---|---|
| JP | 2007156567 A | 6/2007 |
| KR | 100692345 | 3/2007 |
| KR | 100994703 | 11/2010 |

*Primary Examiner* — Thao H Bui
*Assistant Examiner* — Alfredo Bermudez Lozada
(74) *Attorney, Agent, or Firm* — Volentine & Whitt, PLLC

(57) ABSTRACT

A memory device that operates in a low-power operation mode includes a memory cell array, a page size changing circuit, and an encoding and decoding changing circuit. The page size changing circuit changes the number of data items prefetched in the memory cell array according to a power mode during a read operation. The encoding and decoding changing circuit changes a level of data written in the memory cell array according to the power mode during a read operation.

17 Claims, 23 Drawing Sheets

(56) References Cited

U.S. PATENT DOCUMENTS

| | | | |
|---|---|---|---|
| 2004/0233075 A1* | 11/2004 | Park | H03M 7/14 341/59 |
| 2005/0034009 A1* | 2/2005 | Sutardja | G06F 13/405 713/503 |
| 2007/0136544 A1 | 6/2007 | Oda | |
| 2008/0303599 A1* | 12/2008 | Morikoshi | H03L 7/06 331/17 |
| 2009/0106569 A1 | 4/2009 | Roh et al. | |
| 2009/0210611 A1* | 8/2009 | Mizushima | G06F 12/0866 711/103 |
| 2011/0235764 A1* | 9/2011 | Ware | G11C 7/04 375/362 |
| 2011/0280322 A1* | 11/2011 | Suenaga | H04L 25/0278 375/257 |
| 2012/0327726 A1* | 12/2012 | Tsern | G11C 11/4074 365/189.11 |

\* cited by examiner

FIG. 4D

| Code Comb. | | 0o | 1 | 2 | 3 | 4 | 5 | 6 | 7o | 8 | 9 | 10 | 11 | 12 | 13 | DM1 | 15 | 16 | 17 | 18 | 19 | DM2 | 21 | 22 | 23 | 24 | 25 | 7e | 27 | 28 | 29 | 30 | 31 | 0e |
|---|---|---|---|---|---|---|---|---|---|---|---|---|---|---|---|---|---|---|---|---|---|---|---|---|---|---|---|---|---|---|---|---|---|---|
| Sn | A-Bn | 0 | 0 | 0 | 1 | 1 | 1 | 0 | 0 | 0 | 0 | 1 | 1 | 0 | 0 | 0 | 1 | 1 | 0 | 0 | 0 | 1 | 1 | 0 | 0 | 0 | 1 | 1 | 0 | 0 | 0 | 1 | 1 | 1 |
| | B-Cn | 0 | 1 | 1 | 0 | 0 | 1 | 0 | 1 | 1 | 0 | 0 | 1 | 0 | 1 | 1 | 0 | 1 | 0 | 1 | 1 | 0 | 1 | 0 | 1 | 1 | 0 | 0 | 0 | 1 | 1 | 0 | 0 | 1 |
| | C-An | 1 | 0 | 0 | 0 | 1 | 0 | 1 | 0 | 0 | 1 | 0 | 0 | 1 | 0 | 0 | 0 | 0 | 1 | 1 | 1 | 1 | 1 | 1 | 1 | 1 | 1 | 1 | 1 | 0 | 1 | 1 | 1 | 0 |
| S(n+1) | A-B(n+1) | 0 | 0 | 0 | 0 | 0 | 0 | 0 | 0 | 1 | 0 | 0 | 0 | 1 | 0 | 0 | 1 | 0 | 0 | 0 | 0 | 0 | 0 | 1 | 1 | 1 | 0 | 0 | 1 | 1 | 1 | 1 | 1 | 1 |
| | B-C(n+1) | 0 | 0 | 0 | 0 | 0 | 0 | 1 | 0 | 0 | 0 | 1 | 0 | 1 | 1 | 1 | 1 | 1 | 0 | 0 | 0 | 0 | 0 | 0 | 1 | 0 | 0 | 1 | 1 | 0 | 0 | 1 | 1 | 1 |
| | C-A(n+1) | 1 | 1 | 1 | 1 | 1 | 1 | 0 | 0 | 0 | 0 | 0 | 1 | 1 | 1 | 1 | 1 | 1 | 0 | 0 | 0 | 0 | 1 | 1 | 1 | 1 | 1 | 1 | 0 | 0 | 0 | 0 | 0 | 0 |

FIG. 4E

| Symbol | S1_S2 | S3_S4 | S5_S6 | S7_S8 | S9_S10 | S11_S12 | S13_S14 | S15_S16 | S17_S18 | S19_S20 | S21_S22 | S23_S24 | S25_S26 | S27_S28 |
|---|---|---|---|---|---|---|---|---|---|---|---|---|---|---|
| Bit1 | 1 | 6 | 9 | 16 | 17 | 25 | 30 | 33 | 38 | 41 | 48 | 49 | 57 | 62 |
| Bit2 | 2 | 7 | 10 | 22 | 18 | 26 | 31 | 34 | 39 | 42 | 54 | 50 | 58 | 63 |
| Bit3 | 3 | 8 | 11 | 23 | 19 | 27 | 32 | 35 | 40 | 43 | 66 | 51 | 59 | 64 |
| Bit4 | 4 | 14 | 12 | 24 | 20 | 28 | P | 36 | 46 | 44 | 56 | 52 | 60 | P |
| Bit5 | 5 | 15 | 13 | P | 21 | 29 | P | 37 | 47 | 45 | P | 53 | 61 | P |

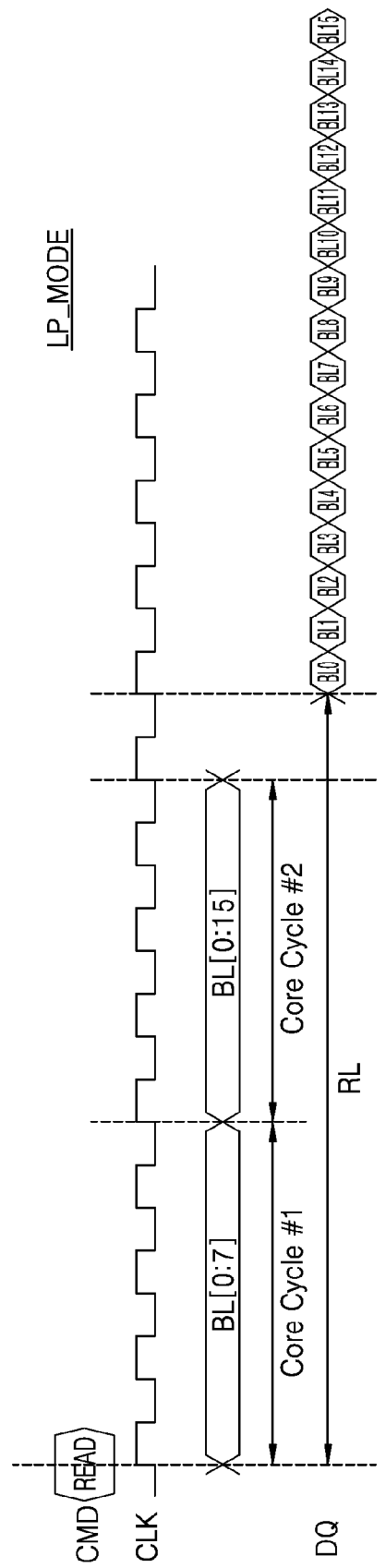

MEMORY DEVICE HAVING DIFFERENT DATA-SIZE ACCESS MODES FOR DIFFERENT POWER MODES

CROSS-REFERENCE TO RELATED APPLICATION

This application claims priority under 35 U.S.C. §119 to Korean Patent Application No. 10-2014-0151220, filed on Nov. 3, 2014, and Korean Patent Application No. 10-2015-0082570, filed on Jun. 11, 2015, in the Korean Intellectual Property Office, the disclosures of which are incorporated by reference herein in their entireties.

BACKGROUND

The disclosure relates to a semiconductor memory device, and more particularly, to a memory device having a reduced power operation mode when the memory device is determined to be operating in a low-power operation mode.

High-speed memory devices have been used to improve system performance of a mobile device. The high-speed memory devices are optimized to have maximum bandwidth. However, typical use of mobile devices may be to watch video files, read Internet pages, or listen to music, which require relatively low-performance tasks. Therefore, reduced power operation mode may be advantageous with respect to the long life of battery power when a user uses the mobile device for low-performance tasks such as described above.

SUMMARY

The disclosure provides a memory device with a low power operation mode.

An exemplary embodiment of the disclosure provides a memory device including a memory cell array, input/output data type changing circuits comprising a decoding circuit and an encoding circuit, and data pins for communicating with external devices. The decoding circuit decodes a data symbol inputted from an external device into internal data that can be written into the memory cell array. The encoding circuit encodes data read from the memory cell array into a data symbol. The data type changing circuits may operate according to different types of data transmission methods depending on whether the memory device operates in a high performance operation mode or a low power operation mode. For example, in the high performance operation mode HP_MODE, the data transmission methods may be a differential type wherein each of the input data type changing circuits compares two inputted data symbols to generate the internal data, and each of the output data type changing circuits compares two internal data items to generate a data symbol. In the low power operation mode LP_MODE, each of the input data type changing circuits compares an inputted data symbol with a reference voltage to generate internal data and each of the output data type changing circuits compares internal data with a reference voltage to generate a data symbol.

An exemplary embodiment of the disclosure provides a memory device including a memory cell array and a page size changing circuit configured to change a size of data prefetched in the memory cell array in response to whether the memory device operates in a high performance operation mode or a low power operation mode.

BRIEF DESCRIPTION OF THE DRAWINGS

Exemplary embodiments of the disclosure will be more clearly understood from the following detailed description taken in conjunction with the accompanying drawings in which:

FIGS. 4A to 4F are exemplary diagrams illustrating an encoding/decoding circuit of FIG. 2 according to exemplary embodiments;

FIGS. 5A and 5B are exemplary timing diagrams illustrating an operation of a page size changing circuit of FIG. 2 according to exemplary embodiments;

DETAILED DESCRIPTION OF THE EMBODIMENTS

Figure 1:
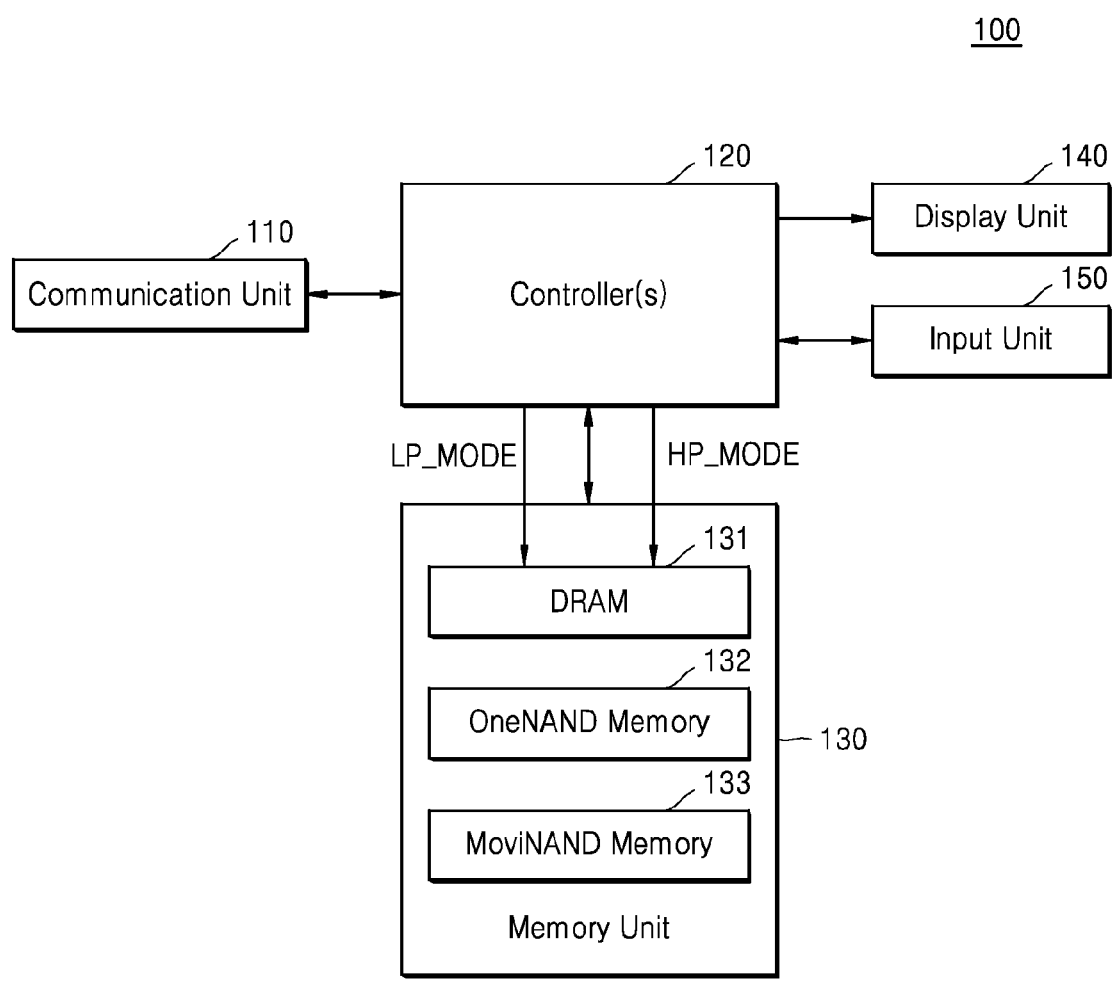
FIG. 1 is an exemplary block diagram of a mobile device including a memory device that may operate in a low power operation mode according to embodiments.

The present disclosure will now be described more fully hereinafter with reference to the accompanying drawings, in which exemplary embodiments of the disclosure are shown. These embodiments are provided so that this disclosure is thorough and complete and fully conveys the scope of the disclosure to one skilled in the art. Accordingly, while the disclosure can be modified in various ways and take on various alternative forms, specific embodiments thereof are shown in the drawings and described in detail below as examples. There is no intent to limit the disclosure to the particular forms disclosed. On the contrary, the disclosure is to cover all modifications, equivalents, and alternatives falling within the spirit and scope of the appended claims. Like reference numerals refer to like elements throughout. In the drawings, the thicknesses of layers and regions may be exaggerated for clarity.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Expressions such as "at least one of" when preceding a list of elements, modify the entire list of elements and do not modify the individual elements of the list.

FIG. 1 is an exemplary block diagram of a mobile device including a memory device that may operate in a low power operation mode according to some embodiments.

Referring to FIG. 1, a mobile device 100 may be a portable terminal such as a Galaxy S phone or an iPhone. The mobile device 100 may include a communication unit 110, a controller 120, a memory unit 130, a display unit 140, and an input unit 150.

The communication unit 110 may receive and transmit a wireless signal corresponding to data input/output through an antenna or data received from a computer system connected through a universal serial bus (USB) port.

The controller 120 may control and process a general operation of the mobile device 100. The controller 120 may control an operation of the memory unit 130 according to a power mode of the mobile device 100. The power mode of the mobile device 100 may be a high-performance mode HP_MODE or a low-power mode LP_MODE. The high-performance mode HP_MODE may be referred to as a high-power mode since power consumption is high and the memory unit 130 operates with high-performance. Power consumption in the low-power mode LP_MODE is relatively less while the memory unit 130 operates with low-performance.

The memory unit 130 may store various computer programs and data for the general operation of the mobile device 100. The memory unit 130 may include at least one dynamic random access memory (DRAM) 131, at least one OneNAND memory 132, and at least one MoviNAND memory 133.

The DRAM 131 may temporarily store data processed in the mobile device 100 by control of the controller 120. Each of the OneNAND memory 132 and the MoviNAND memory 133 may include at least one NAND flash memory device.

The at least one OneNAND memory 132 may perform a function of downloading a bootloader of the mobile device 100 and an operating system (OS), and the at least one MoviNAND memory 133 may perform a mass storage function of the mobile device 100. The at least one MoviNAND memory 133 may be an embedded memory card using a secure digital/multi-media card (SD/MMC) interface protocol. The at least one MoviNAND memory 133 may perform a function of receiving the data stored in the DRAM 131 through the SD/MMC interface and storing the data.

The display unit 140 may display status information and numbers and characters generated while the mobile device 100 is operating. The display unit 140 may display lists and version information of contents stored in the at least one MoviNAND memory 133 by controlling of the controller 120.

The input unit 150 may include various keys to input numbers or character information and outputs functions corresponding to a key input by a user to the controller 120.

Figure 2:
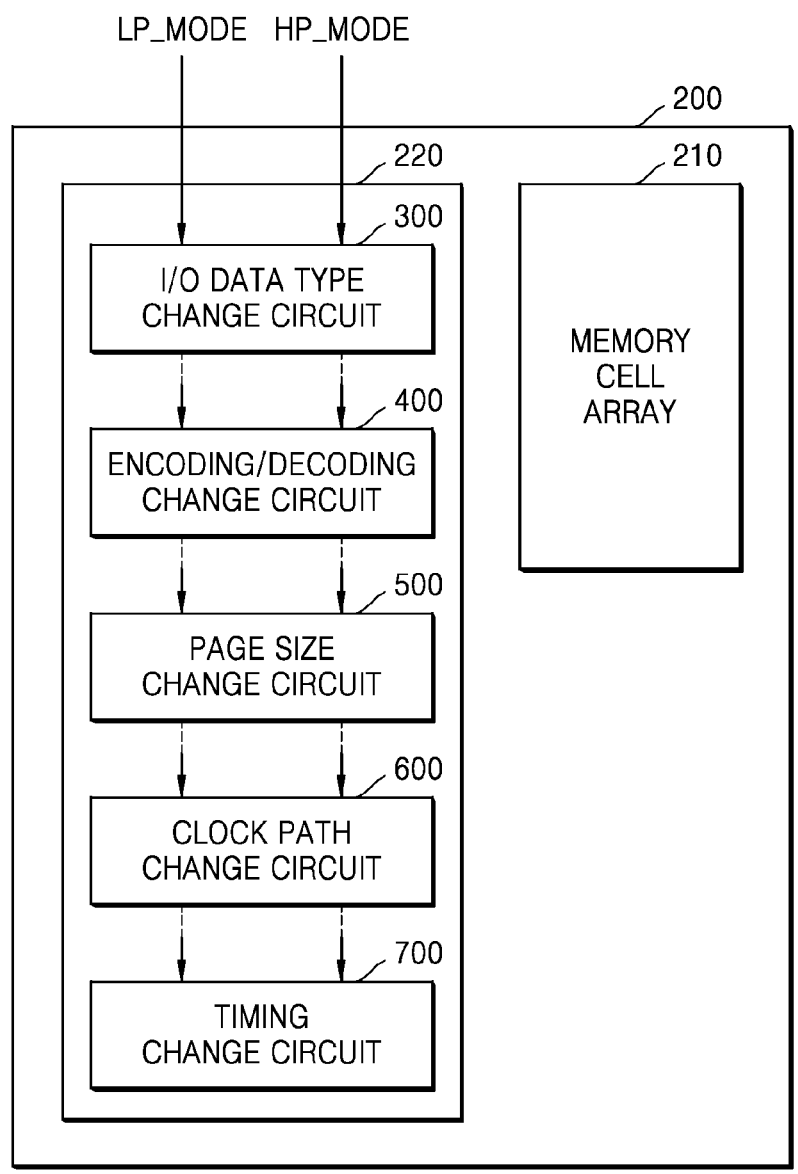
FIG. 2 is an exemplary block diagram illustrating a memory device of FIG. 1 according to an embodiment.

FIG. 2 is an exemplary block diagram illustrating a memory device of FIG. 1 according to one embodiment.

Referring to FIG. 2, a memory device 200 may include a memory cell array 210 and power mode changing circuits 220. The memory device 200 may be the DRAM 131 of FIG. 1. The memory cell array 210 may include a plurality of memory cells arranged in rows and columns Each of the memory cells may include one access transistor and one storage unit capacitor. The memory cells are respectively formed at intersections of word lines and bit lines in a form matrix structure. The memory device 200 may write data in the memory cells of the memory cell array 210 when the memory device 200 performs writing and may output data read from the memory cells of the memory cell array 210 when the memory device 200 performs a reading operation.

According to an exemplary embodiment, the memory cell array 210 may be a three-dimensional (3D) memory array. The 3D memory array is monolithically formed in an active region on a silicon substrate and has at least one layer of a physical level of memory cell arrays having circuits formed on or in the substrate as circuits related to operations of the memory cells. The term "monolithic" means that layers of respective levels forming an array are laminated directly above layers of respective lower levels in the 3D memory array.

U.S. Pat. No. 7,679,133, U.S. Pat. No. 8,553,466, U.S. Pat. No. 8,654,587, U.S. Pat. No. 8,559,235, and No. 2011/0233648, which are incorporated in the present disclosure by reference, describe configurations of a 3D memory array in which a 3D memory array has layers including a plurality of levels and word lines and/or bit lines that are shared between the pluralities of levels.

The power mode changing circuits 220 may include an input/output data type changing circuit 300, an encoding/decoding changing circuit 400, a page size changing circuit 500, a clock path changing circuit 600, and a timing changing circuit 700, which may be functional in a low-power mode LP_MODE or a high-performance mode HP_MODE of the memory device 200.

The input/output data type changing circuit 300 may allow an internal node of the input/output data type changing circuit 300 to have a data symbol according to data applied to data pins of the memory device 200 in the high-performance mode HP_MODE, and may allow the internal node of the input/output data type changing circuit 300 to receive a single item of data applied to data pins of the memory device 200 in the low-power mode LP_MODE.

The encoding/decoding changing circuit 400 may generate symbols based on the data applied to the data pins of the memory device 200, encode the generated symbols and convert the symbols into data bits that can be written in the memory cell array 210 in the high-performance mode HP_MODE, and may transmit serially or in parallel outputs of comparators, configured to compare the data applied to the data pins of the memory device 200 with a first reference voltage, to the memory cell array 210 in the low-power mode LP_MODE.

The page size changing circuit 500 may prefetch data from the memory cell array 210 during one core cycle operation for prefetching data from the memory cell array 210 in a high-performance mode, and may prefetch data from the memory cell array 210 during at least two core cycle operations in a low-power mode. The page size changing circuit 500 may prefetch data in a first burst length from the memory cell array 210 during one core cycle operation and output the prefetched data through data input/output pins of first and second groups in a high-performance mode, and may prefetch data in a second burst length less than the data corresponding to the first burst length from the memory cell array 210 during the one core cycle operation and output the prefetched data through the data input/output pins of the first group in a low-power mode.

The clock path changing circuit 600 may transmit an internal clock signal generated based on a clock signal received through a clock buffer to high-performance tree circuits operating based on a current mode logic (CML) in a high-performance mode, and may transmit the internal clock signal to low-power tree circuits operated at a complementary metal-oxide semiconductor (CMOS) level in a low-power mode.

The timing changing circuit 700 may set a tRCD time between a time when a low active command is applied to the memory device 200 and a time when a read command is applied to the memory device 200 as a first time period and perform a sensing operation for sensing data read from the memory cell array 210 by a first current in a high-performance mode, and may set the tRCD time as a second time period longer than the first time period and perform the sensing operation by a second current less than the first current in a low-power mode.

Operations of the input/output data type changing circuit 300, the encoding/decoding changing circuit 400, the page size changing circuit 500, the clock path changing circuit 600, and the timing changing circuit 700 will be described in detail in FIGS. 3 to 10.

Figure 3A:
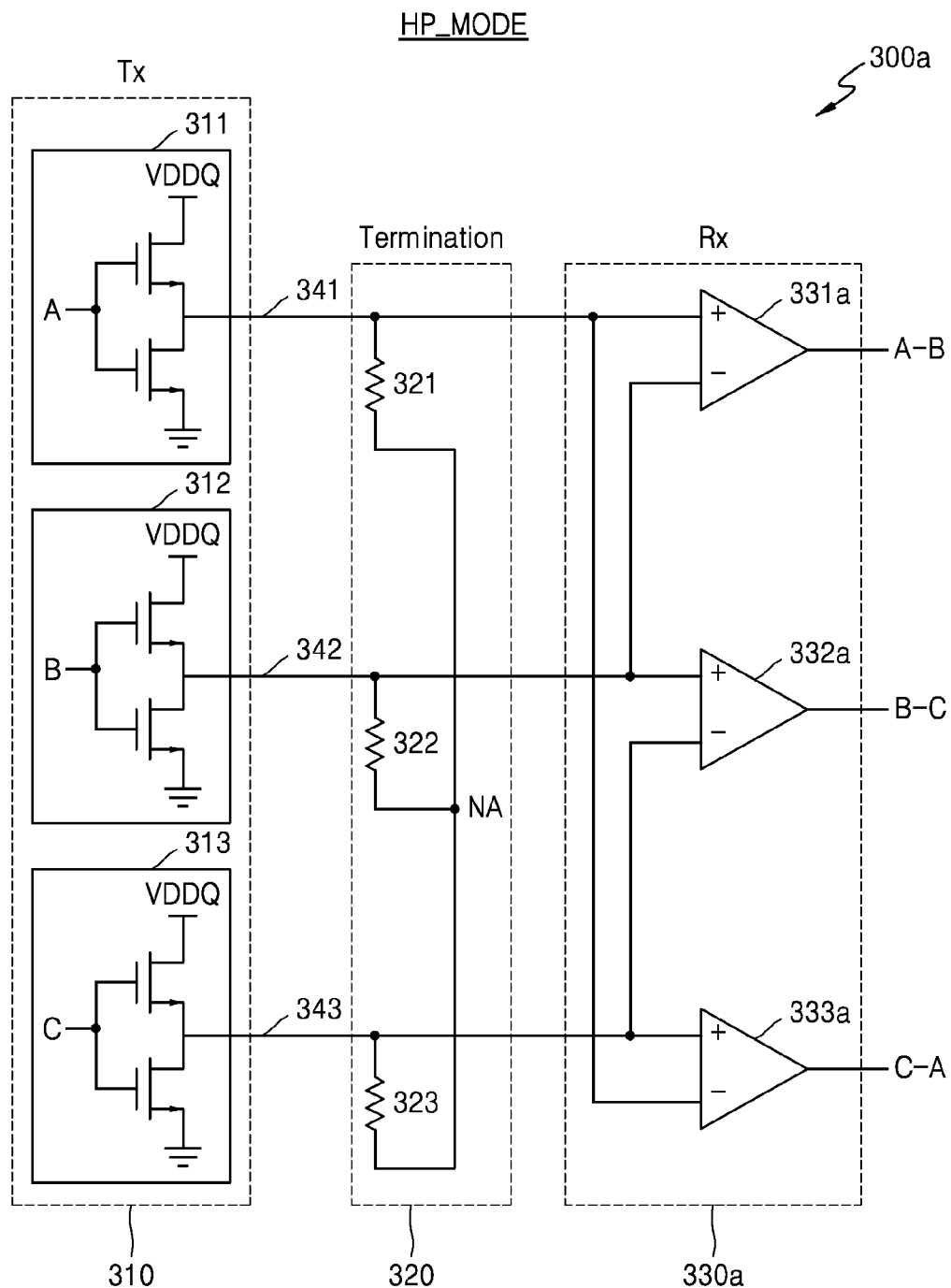
FIGS. 3A and 3B are exemplary block diagrams illustrating an input/output data type changing circuit of FIG. 2 according to exemplary embodiments.
Figure 3B:
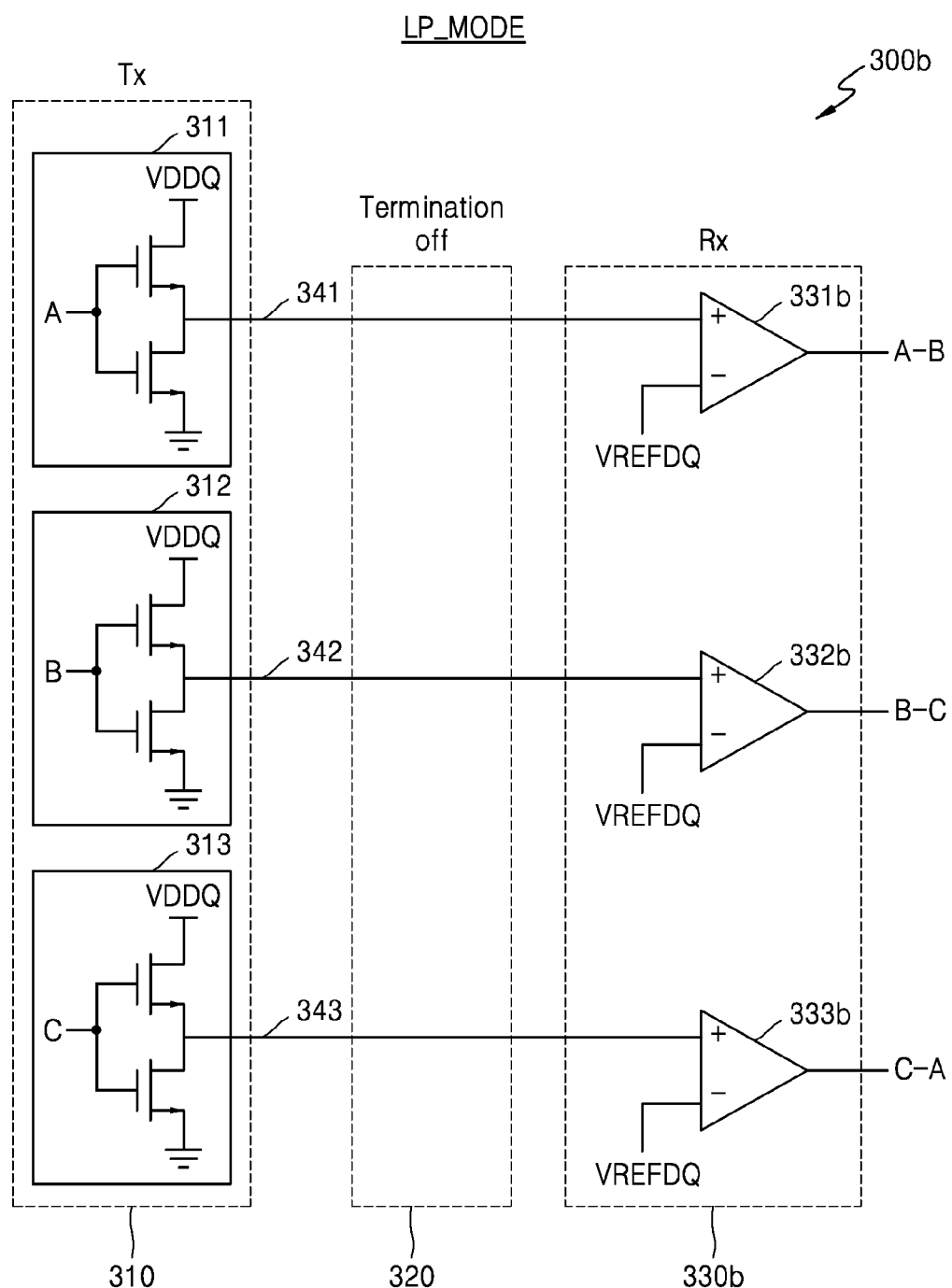

FIGS. 3A and 3B are exemplary block diagrams illustrating an input/output data type changing circuit of FIG. 2 according to exemplary embodiments. FIG. 3A illustrates an input/output data type changing circuit 300a in the high-performance mode HP_MODE and FIG. 3B illustrates an input/output data type changing circuit 300b in the low-power mode LP_MODE.

Referring to FIG. 3A, the input/output data type changing circuit 300a in the high-performance mode HP_MODE may include a transmitter 310, a terminator 320, and a first receiver 330a.

The transmitter 310 may include a plurality of output buffers 311, 312, and 313. The first output buffer 311 may include an inverter connected between a power source voltage VDDQ and a ground voltage VSSQ and input a first input A. An output of the first output buffer 311 is output to a first line 341. The second output buffer 312 may include an inverter connected between a power source voltage VDDQ and a ground voltage VSSQ and input a second input B. An output of the second output buffer 312 is output to a second line 342. The third output buffer 313 may include an inverter connected between a power source voltage VDDQ and a ground voltage VSSQ and input a third input C. An output of the third output buffer 313 is output to a third line 343. According to an exemplary embodiment, the transmitter 310 may include various number of output buffers other than the three output buffers 311, 312, and 313.

The terminator 320 may perform a function of termination of first to third lines 341 to 343 to have multi-levels. The terminator 320 may include a first resistance 321 connected between the first line 341 and a node NA, a second resistance 322 connected between the second line 342 and the node NA, and a third resistance 323 connected between the third line 343 and the node NA. The node NA is an internal node to which the first to third resistances 321 to 323 are commonly connected, and terminates the first to third lines 341 to 343 to have multi-levels without performing full-swing between the power source voltage VDDQ and the ground voltage VSSQ. Therefore, the first to third lines 341 to 343 have an input/output data type of multi-level signaling.

The first receiver 330a may include a plurality of input buffers 331a to 333a connected to the first to third lines 341 to 343. The first input buffer 331a may include a differential amplifier in which the terminated first line 341 is connected to a first input terminal (+) and the terminated second line 342 is connected to a second input terminal (−). The first input buffer 331a outputs a first output A-B based on the voltage levels of the terminated first and second lines 341 and 342.

The second input buffer 332a may include a differential amplifier in which the terminated second line 342 is connected to a first input terminal (+) and the terminated third line 343 is connected to a second input terminal (−). The second input buffer 332a outputs a second output B-C based on the voltage levels of the terminated second and third lines 342 and 343. The third input buffer 333a may include a differential amplifier in which the terminated third line 343 is connected to a first input terminal (+) and the terminated first line 341 is connected to a second input terminal (−). The third input buffer 333a outputs a third output C-A based on the voltage levels of the terminated third and first lines 343 and 341.

The first to third outputs A-B, B-C, and C-A may be used in an encoding/decoding changing circuit 400a of a high-performance mode described in FIGS. 4A to 4E. The first to third outputs A-B, B-C, and C-A may be used in the high-performance mode HP_MODE in a demapping operation in which the first to third outputs A-B, B-C, and C-A are converted into data bits written in the memory cell array 210 (of FIG. 2) or in a mapping operation in which the first to third outputs A-B, B-C, and C-A are converted from data bits read from the memory cell array 210.

Referring to FIG. 3B, the input/output data type changing circuit 300b operates in the low-power mode LP_MODE and may include a transmitter 310 and a second receiver 330b. The input/output data type changing circuit 300b does not include a terminator, unlike the input/output data type changing circuit 300a of FIG. 3A.

The transmitter 310 is identical to the transmitter 310 in the input/output data type changing circuit 300a of FIG. 3A. The transmitter 310 may include first to third output buffers 311, 312, and 313 connected between a power source voltage VDDQ and a ground voltage VSSQ. Each of the first to third output buffers 311 to 313 may include an inverter inputting first to third inputs A to C, respectively. An output of the first output buffer 311 is output to a first line 341, an output of the second output buffer 312 is output to a second line 342, and an output of the third output buffer 313 is output to a third line 343.

As the first to third lines 341 to 343 are not terminated, the first to third lines 341 to 343 have voltage levels for performing full-swing between the power source voltage VDDQ and the ground voltage VSSQ according to the outputs of the first to third output buffers 311 to 313. In other words, the first to third lines 341 to 343 have input/output data types of data signaling having a logic high level of the power source voltage VDDQ or a logic low level of the ground voltage VSSQ.

The second receiver 300b may include first to third input buffers 331b to 333b comparing a first reference voltage VREFDQ and voltage levels of the first to third lines 341 to 343. The first input buffer 331b outputs a first output A-B by comparing the voltage level of the first line 341 and the first reference voltage VREFDQ. The second input buffer 332b outputs a second output B-C by comparing the voltage level of the second line 342 and the first reference voltage VREFDQ. The third input buffer 332c outputs a third output C-A by comparing the voltage level of the third line 343 and the first reference voltage VREFDQ.

Since the input/output data type changing circuit 300b in the low-power mode LP_MODE does not perform a multi-level signaling operation of the input/output data type changing circuit 300b in the high-performance mode HP_MODE, power consumption of the memory device 200 may be reduced.

Figure 4A:
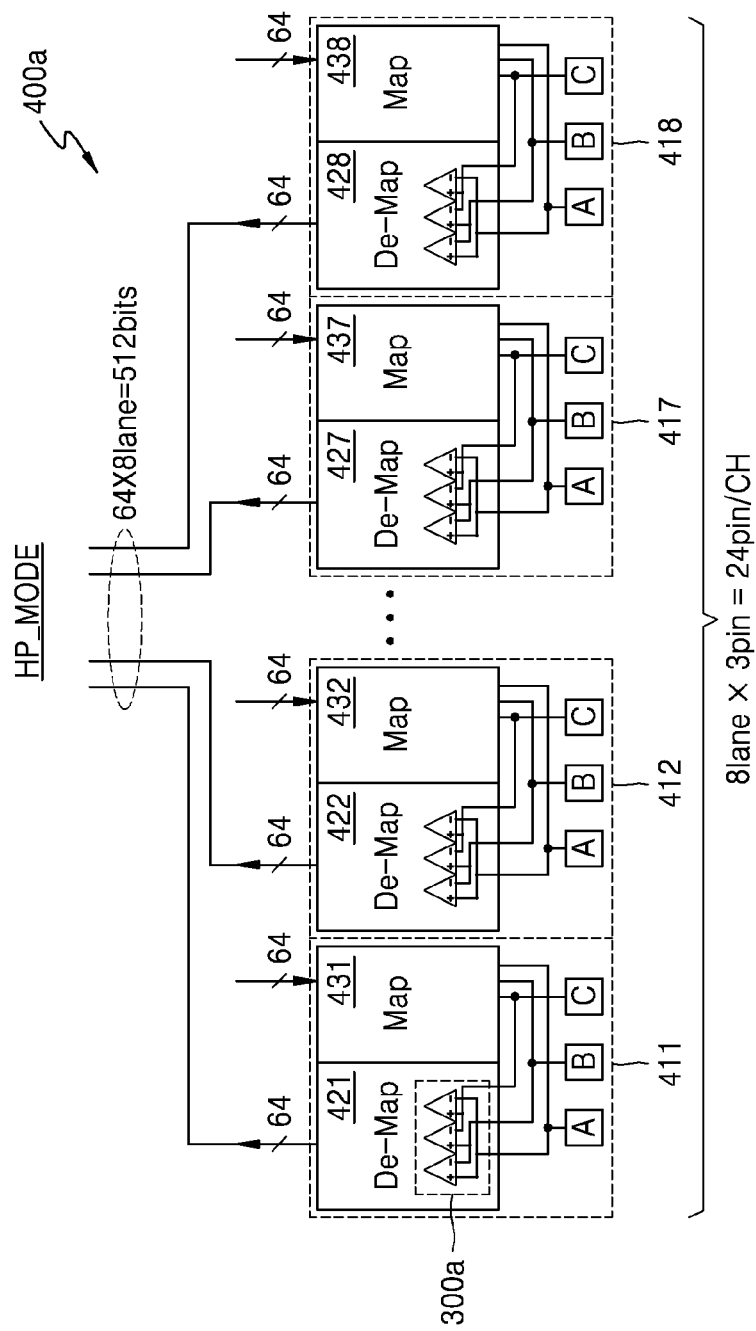
Figure 4B:
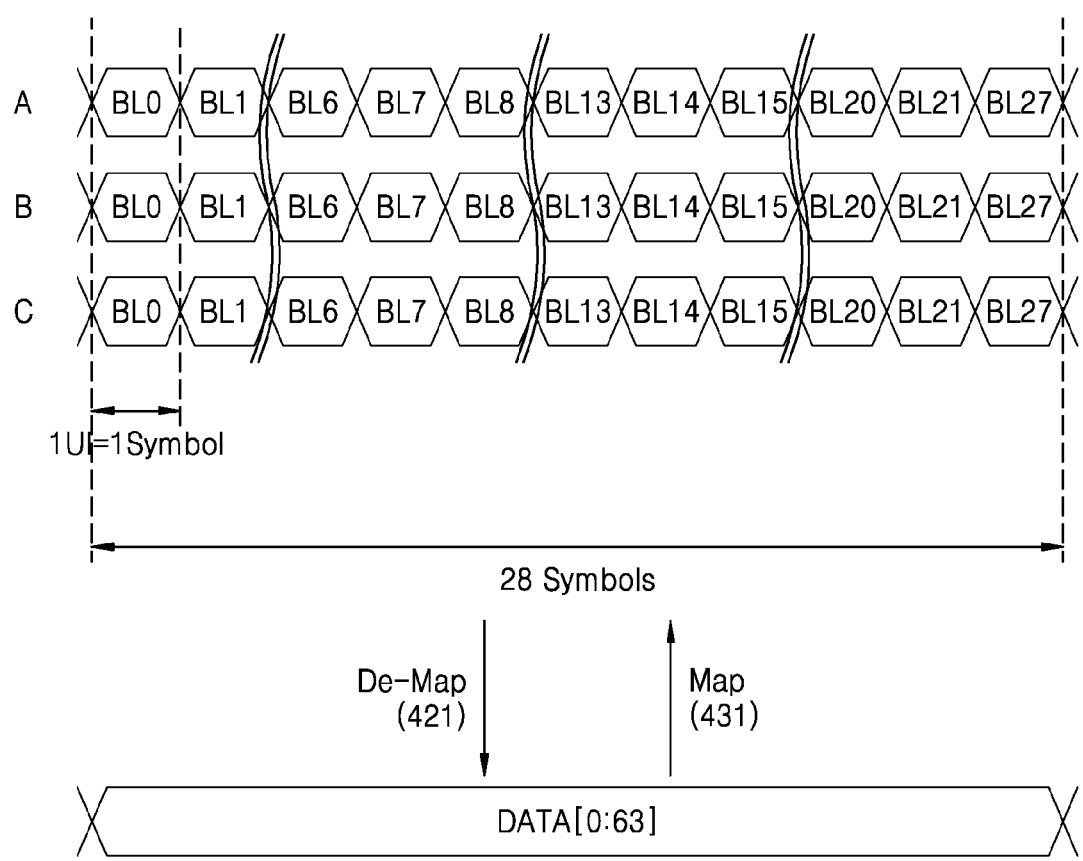
Figure 4C:
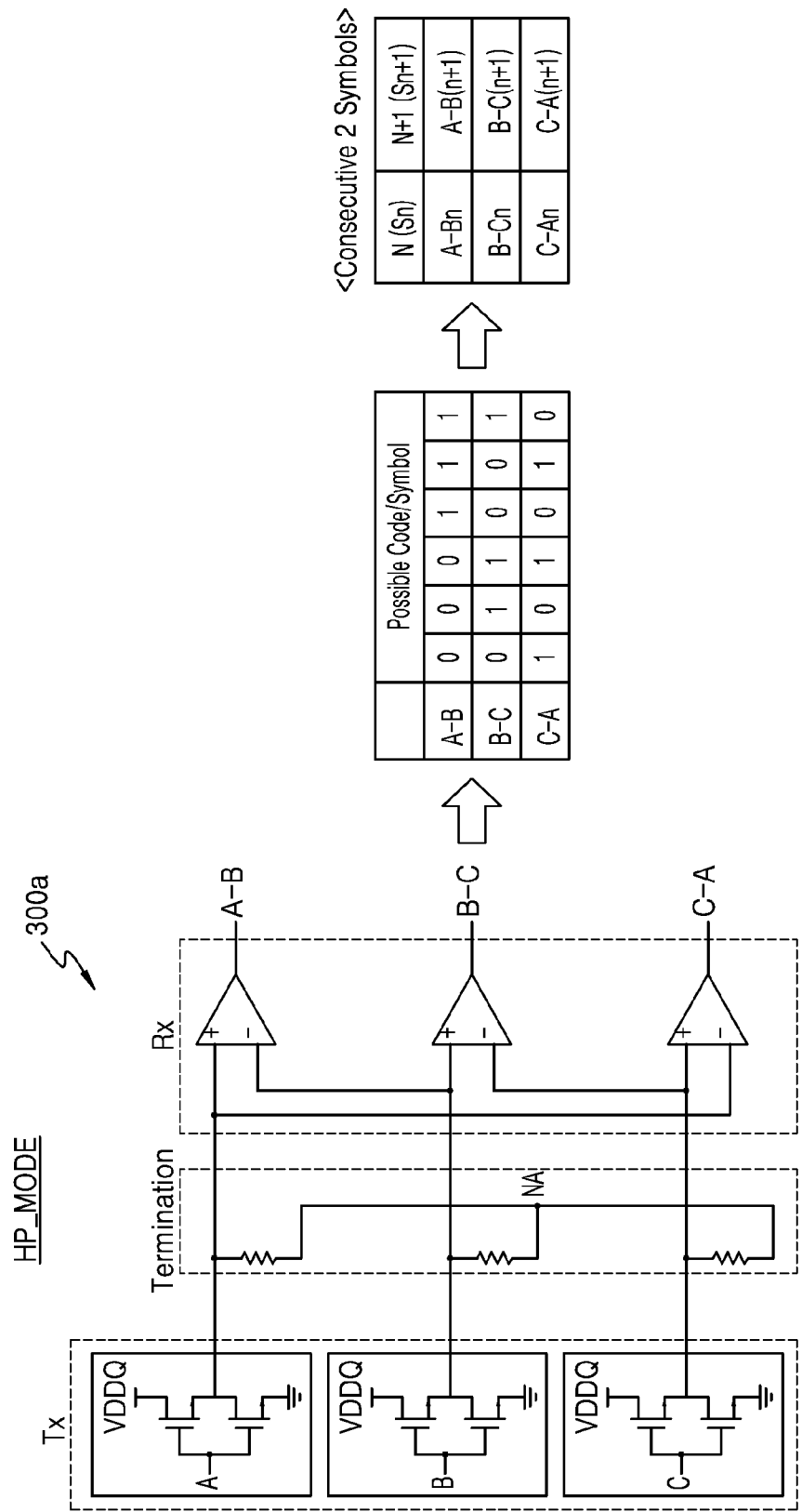
Figure 4F:
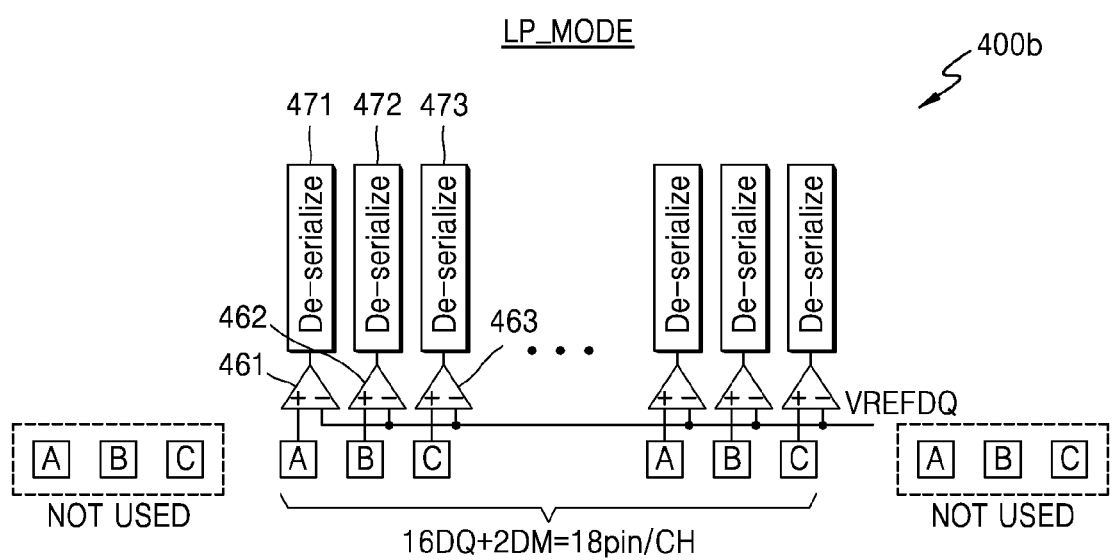

FIGS. 4A to 4F are exemplary diagrams illustrating the encoding/decoding changing circuit of FIG. 2 according to exemplary embodiments. FIGS. 4A to 4E illustrate an encoding/decoding changing circuit 400a in the high-performance mode HP_MODE and FIG. 4F illustrates an encoding/decoding changing circuit 400b in the low-power mode LP_MODE according to exemplary embodiments.

Referring to FIG. 4A, the encoding/decoding changing circuit 400a may provide an interface function of the memory device 200 (of FIG. 2). The memory device 200 may include a plurality of independent interfaces referred to as channels. Each of the channels includes an independent memory bank and is independently clocked; furthermore, each may perform an independent command and provide an independent data interface.

For simple and concise description, the encoding/decoding changing circuit 400a is described as being assigned to one channel CH. The operation principle of the encoding/decoding changing circuit 400a assigned to the channel CH may be equally applicable to other channels in the memory device 200 (of FIG. 2).

The encoding/decoding changing circuit 400a may provide an interface of transmitting data, for example, 512-bit data per channel CH to the memory cell array 210 (of FIG. 2). The 512-bit data may be divided into 64-bit data, and the divided 64-bit data may be designed to be transmitted through eight lanes 411 to 418. The lanes 411 to 418 may respectively include de-map blocks 421 to 428 and map blocks 431 to 438, to which three data pins A to C are connected.

According to the present exemplary embodiment, the data pins A to C are allocated in one lane and eight lanes are included in one channel CH, and furthermore, 24 data pins form one channel CH.

The de-map blocks 421 to 428 of the respective lanes 411 to 418 may combine data provided to the data pins A to C into 28 symbols, and may demap the 28 symbols to be converted into 64-bit data. The demapping operation may be referred to as a decoding operation.

The map blocks 431 to 438 of the respective lanes 411 to 418 may map the 64-bit data read from the memory cell array 210 (of FIG. 2) to be converted into 28 symbols. The mapping operation may be referred to as an encoding operation.

Referring to FIG. 4B, the first lane 411 from among the lanes 411 to 418 is described. The explanation regarding the first lane 411 may be identically applied to the remaining lanes 412 to 418. Twenty-eight (28) symbols based on burst data BL0 to BL27 applied to three data pins A to C are shown in the first lane 411. Respective burst data applied to data pins A to C, for example, first burst data BL0 may be defined as a unit interval (hereinafter, abbreviated as "UI"), and data maintained during one UI may be defined as one symbol.

In this case, 28 symbols of the first lane 411 are converted into 64-bit data through the de-map block 421. The converted 64-bit data may be written in the memory cell array 210 (of FIG. 2) in the memory device 200 (of FIG. 2). The 64-bit data read from the memory cell array 210 may be converted into 28 symbols through the map block 431. The converted 28 symbols may be output through the data pins A to C.

Referring to FIG. 4C, according to an exemplary embodiment, a symbol is formed based on data applied to three data pins A to C. The data pins A to C may respectively correspond to a first input A, a second input B, and a third input C in order to connect with the multi-level signaling described in the input/output data type changing circuit 300a in the high-performance mode HP_MODE of FIG. 3A. The input/output data type changing circuit 300a may output first to third outputs A-B, B-C, and C-A in response to the first to third inputs A to C, respectively. The first to third outputs A-B, B-C, and C-A may form a symbol.

The symbol formed of the first to third outputs A-B, B-C, and C-A of the input/output data type changing circuit 300a may be configured to have 3-bit data. The symbol of 3-bit data may represent any one of six codes excluding 000 and 111, that is, 010, 011, 100, 101, and 110. In other words, one symbol indicates one of six prospective codes.

According to an exemplary embodiment, two continuous symbols, for example, Nth symbol (Sn) and N+1th symbol (Sn+1), may be combined to represent any one of 6×6=36, that is, 36 codes. According to an exemplary embodiment, it is possible to combine 36 codes as illustrated in FIG. 4D. In a table of FIG. 4D, 36 codes may be divided into data codes 0 to 31 and data masks DM1 and DM2. This means that data information and data mask information may be extracted from the 36 codes combined by the two continuous symbols.

In this case, 32 data codes 0 to 31 may be converted into 5-bit binary data. Mapping/demapping between the two continuous symbols S1-S2, S3-S4, . . . , S25-S26, and S27-S28 from among the 28 symbols S1 to S28 and the 5-bit binary data may be illustrated, for example, in a table of FIG. 4E. In the table of FIG. 4E, the 28 symbols S1 to S28 may be converted into 64-bit data (1 64). According to another exemplary embodiment, the 64-bit data may be converted into 28 symbols S1 to S28.

Referring to FIG. 4F, an encoding/decoding changing circuit 400b in a low-power mode LP_MODE may include 16 data pins DQ per channel CH and two data mask pins DM, that is 18 pins. The encoding/decoding changing circuit 400b in the low-power mode LP_MODE may reduce six pins by reducing pins activated per channel CH from 24 to 18, unlike the encoding/decoding changing circuit 400a in the high-performance mode HP_MODE.

The encoding/decoding changing circuit 400b may transmit input signals A to C applied to data pins DQ and mask pins DM by comparing with a first reference voltage VREFDQ with a single-ended method. The encoding/decoding changing circuit 400b may include comparators 461 to 463 comparing voltage levels of the input signals A to C with the first reference voltage VREFDQ, and deserializers 471 to 473 transmitting outputs of the comparators 461 to 463 serially or in parallel.

Since the encoding/decoding changing circuit 400b in the low-power mode LP_MODE does not perform the demapping and mapping operations described in FIGS. 4B to 4D, the power consumption of the memory device 200 may be smaller than the power consumption of high performance operation mode HP_MODE.

Figure 5A:
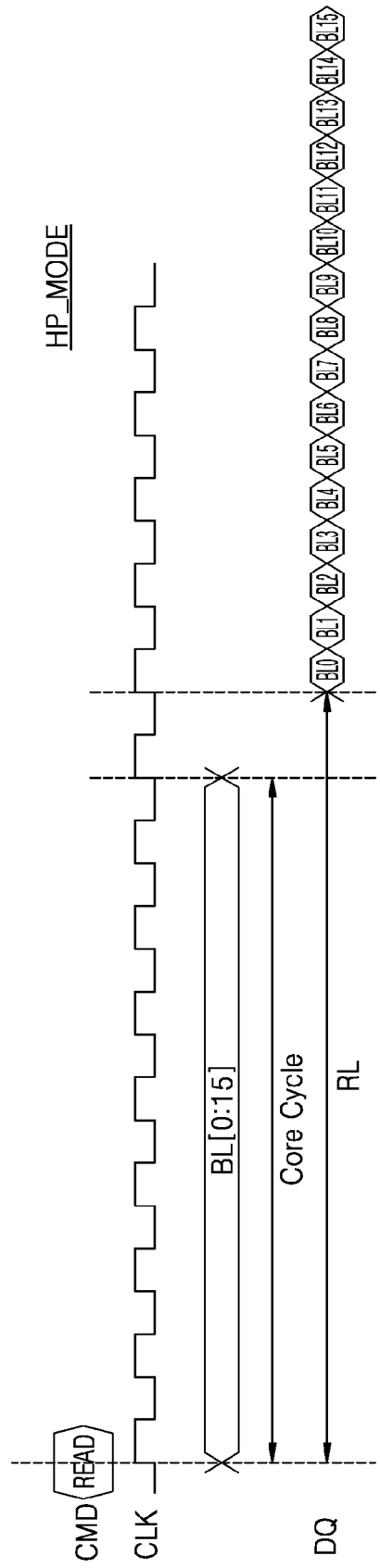

FIGS. 5A and 5B are exemplary timing diagrams illustrating an operation of a page size changing circuit of FIG. 2 according to exemplary embodiments.

In FIG. 5A, the page size changing circuit 500 (of FIG. 2) may perform a core cycle operation prefetching data from a memory core region including the memory cell array 210 (of FIG. 2). The page size changing circuit 500 (of FIG. 2) may prefetch a burst length, e.g., several pieces of data BL0 to BL15 corresponding to BL=16, through one core cycle operation in the high-performance mode HP_MODE of the memory device 200 (of FIG. 2). The prefetched burst data BL0 to BL15 may be output to data input/output pads DQ after a read latency RL in response to a read command READ.

In FIG. 5B, the page size changing circuit 500 (of FIG. 2) may prefetch several data sets of data BL0 to BL15 read from the memory device in a burst length of sixteen through two core cycle operations in the low-power mode LP_MODE of the memory device 200 (of FIG. 2). Burst data BL0 to BL7 of a first group may be prefetched during a first core cycle operation and burst data BL8 to BL15 of a second group may be prefetched during a second core cycle operation. The burst data BL0 to BL7 of the first group and the burst data BL8 to BL15 of the second group may be output to data input/output pads DQ after read latency RL in response to a read command READ.

According to an exemplary embodiment, the page size changing circuit 500 (of FIG. 2) may prefetch several data sets corresponding to a burst length through several core cycle operations other than the two core cycle operations in the low-power mode LP_MODE. Accordingly, the power consumption of the page size changing circuit 500 may be minimized by reducing current consumption for data prefetching from the memory core region each time in a low-power mode LP_MODE.

Figure 6A:
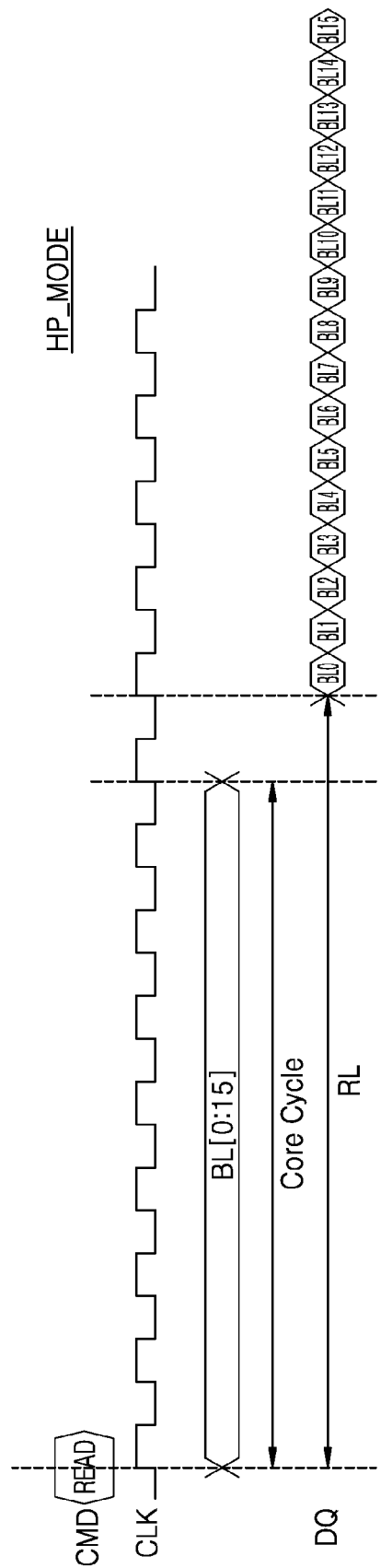
FIGS. 6A and 6B are exemplary timing diagrams illustrating an operation of a page size changing circuit of FIG. 2 according to exemplary embodiments.
Figure 6B:
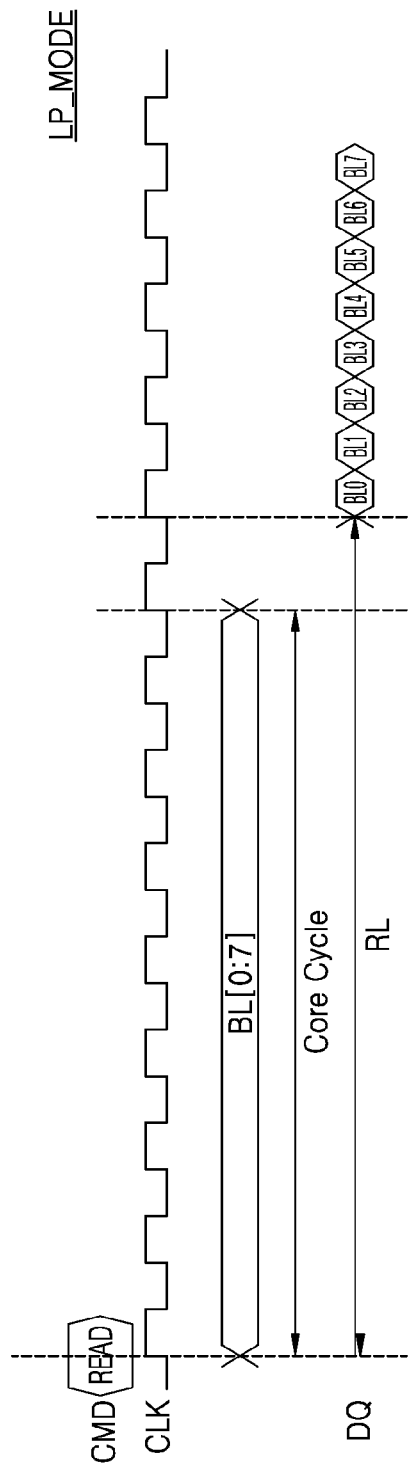

FIGS. 6A and 6B are exemplary timing diagrams illustrating the operation of the page size changing circuit of FIG. 2 according to exemplary embodiments. The page size changing circuit 500 (of FIG. 2) may change the length of a burst in response to an amount of data read from the memory device 200 of FIG. 2 in accordance with whether the memory device operates in the high-performance mode HP_MODE or the low-power mode LP_MODE.

In FIG. 6A, the page size changing circuit 500 (of FIG. 2) may read several data sets of data BL0 to BL15 corresponding to a first burst length, e.g., BL=16, through one core cycle operation in a high-performance mode HP_MODE. In FIG. 6B, the page size changing circuit 500 (of FIG. 2) may read several pieces of data BL0 to BL7 corresponding to a second burst length, e.g., BL=8, through one core cycle operation in a low-power mode LP_MODE. That is, in the low-power mode LP_MODE of the memory device 200 (of FIG. 2), the page size changing circuit 500 (of FIG. 2) may read data corresponding to the second burst length that is less than the data corresponding to the first burst length in the high-performance mode HP_MODE.

Figure 7A:
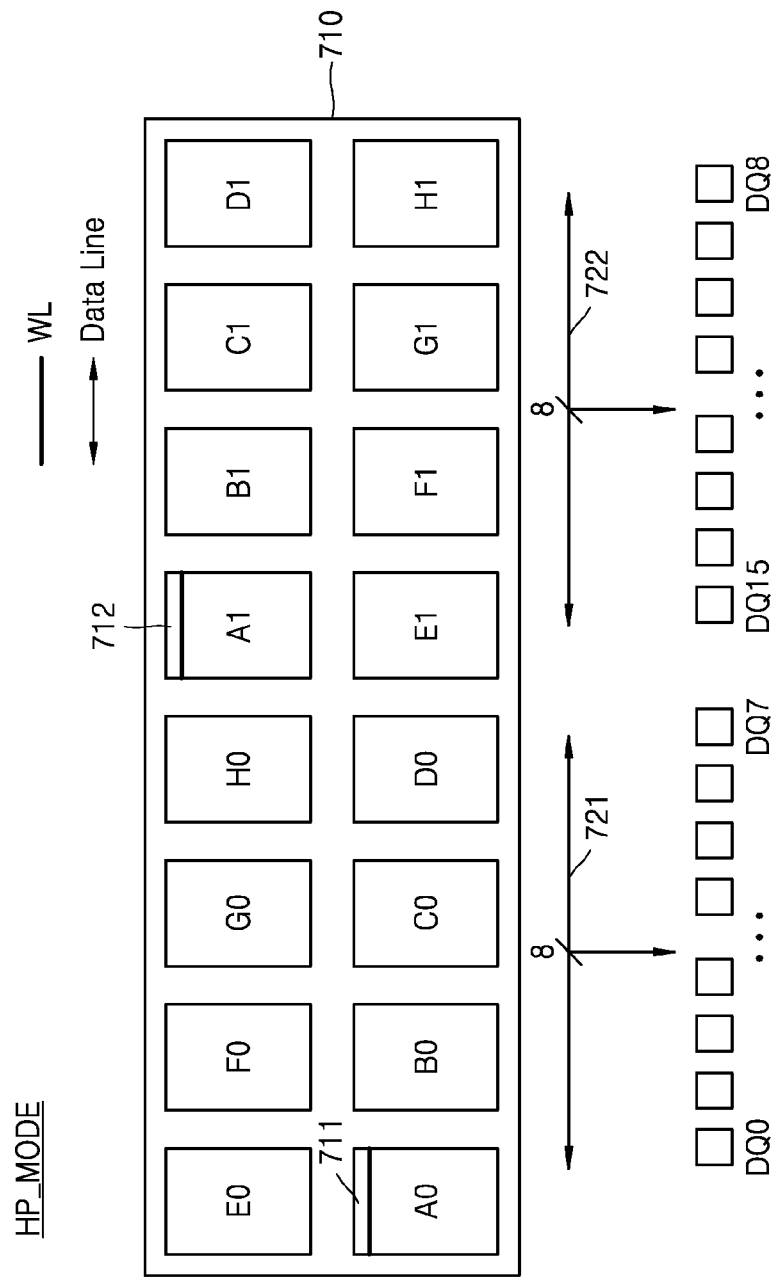
FIGS. 7A and 7B are exemplary block diagrams illustrating a page size changing circuit of FIG. 2 according to exemplary embodiments.
Figure 7B:
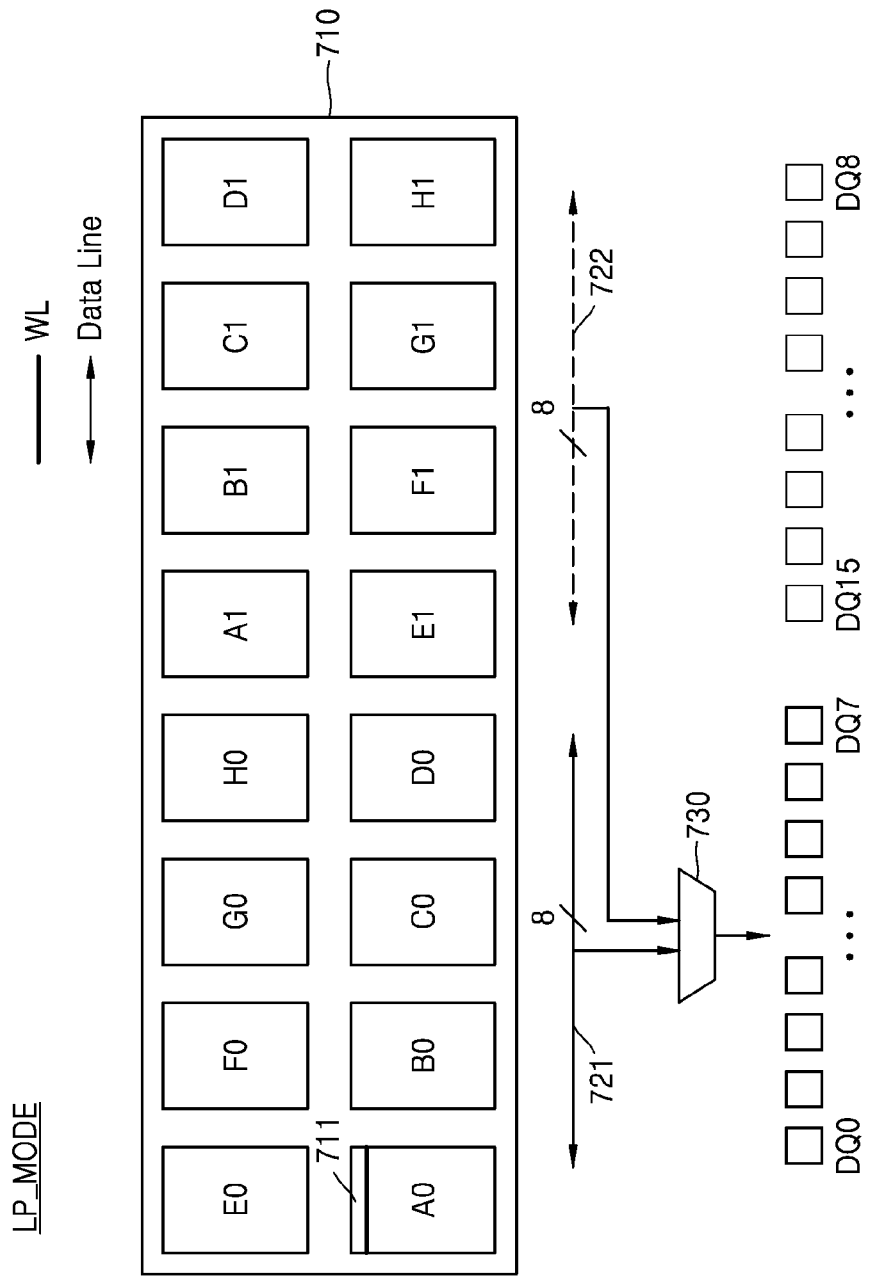

FIGS. 7A and 7B are exemplary block diagrams illustrating the page size changing circuit of FIG. 2 according to an exemplary embodiment. The page size changing circuit 500 (of FIG. 2) may change the number of data input/output pins activated in response to an amount of data accessed according to whether the operation power mode is high performance operation mode HP_MODE or low power operation mode LP_MODE.

Referring to FIG. 7A in relation with the high-performance mode HP_MODE of FIG. 6A, data BL0 to BL15 corresponding to a first burst length BL=16 read from a memory core region 710 may be output to 16 data input/output pins DQ0 to DQ15. The memory core region 710 includes a plurality of memory banks A to H and the memory banks A to H are respectively divided into sub banks (A0, A1) to (H0, H1). The first sub banks A0 to H0 are electrically connected to data input/output pins DQ0 to DQ7 of a first group through first data lines 721 and the second sub banks A1 to H1 are electrically connected to data input/output pins DQ8 to DQ15 of a second group through second data lines 722.

The page size changing circuit 500 (of FIG. 2) in the high-performance mode HP_MODE of the memory device 200 (of FIG. 2), outputs data BL0 to BL15 corresponding to a first burst length BL=16 read from memory cells connected to word lines 711 and 712 activated in the sub banks A0 and A1 of the first memory bank A to the data input/output pins DQ0 to DQ15 through the first and second data lines 721 and 722. In other words, the data input/output pins DQ0 to DQ15 are activated in the high-performance mode HP_MODE.

In FIG. 7B, the page size changing circuit 500 (of FIG. 2) in the in low-power mode LP_MODE of the memory device 200 (of FIG. 2), outputs data BL0 to BL15 corresponding to a first burst length BL=16 read from memory cells connected to the word line 711 activated in the first sub bank A0 of the first memory bank A to the data input/output pins DQ0 to DQ7 of the first group through the first data line 721. The first and second data lines 721 and 722 are selectively connected to the data input/output pins DQ0 to DQ7 of the first group through the selector 730. In other words, the data input/output pins DQ0 to DQ7 are activated in the low-power mode LP_MODE of the memory device 200 (of FIG. 2).

Figure 8:
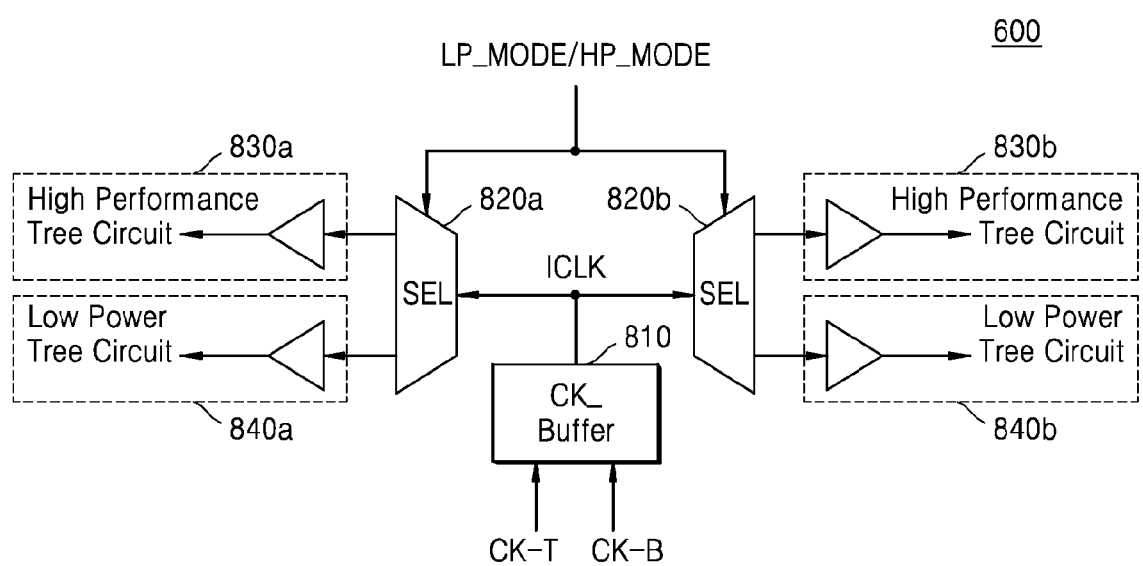
FIG. 8 is an exemplary block diagram illustrating a clock path changing circuit of FIG. 2 according to exemplary embodiments.

FIG. 8 is an exemplary block diagram illustrating the clock path changing circuit 600 of FIG. 2 according to exemplary embodiments.

Referring to FIG. 8, the clock path changing circuit 600 may selectively change a clock path according to the high-performance mode HP_MODE or the low-power performance LP_MODE. The clock path changing circuit 600 includes a clock buffer 810, first and second selectors 820a and 820b, first and second high-performance tree circuits 830a and 830b, and first and second low-power tree circuits 840a and 840b. The first and second high-performance tree circuits 830a and 830b may transmit an internal clock signal ICLK at a high speed based on a current mode logic (CML). The first and second low-power tree circuits 840a and 840b may transmit the internal clock signal ICLK at a low speed by operating at a CMOS level.

The clock buffer 810 may output the internal clock signal ICLK in response to a first clock signal CK_T and a second clock signal CK_B. The first and second clock signals CK_T and CK_B are complementary clock signals to each other. First and second selectors 820a and 820b may transmit the internal clock signal ICLK to first and second high-performance tree circuits 830a and 830b in the high-performance mode HP_MODE of the memory device 200 (of FIG. 2) and transmit the internal clock signal ICLK to first and second low-power tree circuits 840a and 840b in the low-power mode LP_MODE of the memory device 200 (of FIG. 2).

Figure 9A:
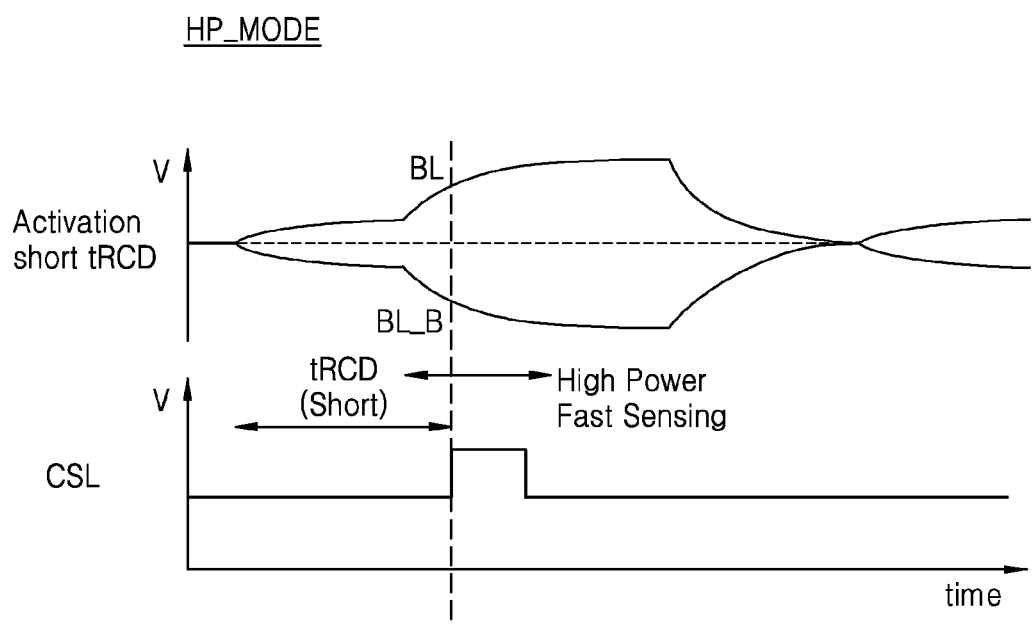
FIGS. 9A and 9B are exemplary timing diagrams illustrating an operation of a timing changing circuit of FIG. 2 according to exemplary embodiments.
Figure 9B:
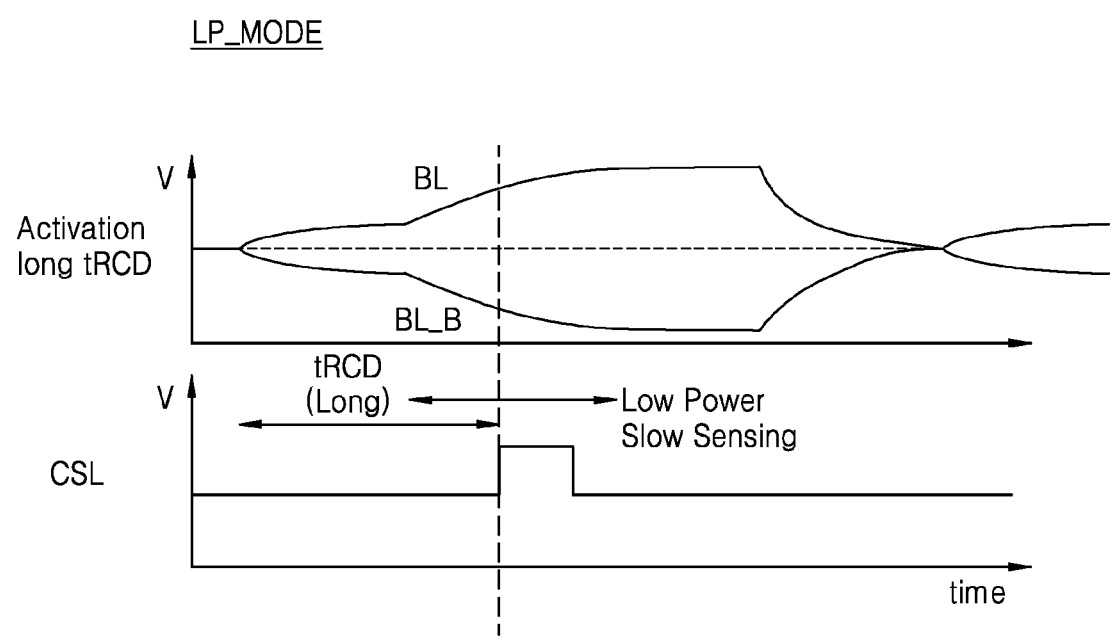

FIGS. 9A and 9B are exemplary timing diagrams illustrating the operation of the timing changing circuit of FIG. 2 according to exemplary embodiments. The timing changing circuit 700 (of FIG. 2) may change an AC timing of the memory device 200 (of FIG. 2) according to a power mode (an HP_MODE or an LP_MODE) of the memory device 200 (of FIG. 2). The timing changing circuit 700 (of FIG. 2) may change a DC parameter according to the changed AC timing.

In FIG. 9A, a tRCD time, which is a time period between row activation and read command applied to the memory device 200 (of FIG. 2), is controlled to have relatively small delay by the timing changing circuit 700 (of FIG. 2) in the high-performance mode HP_MODE of the memory device 200 (of FIG. 2). In this case, the timing changing circuit 700 may perform a bit line sensing operation for sensing memory cell data according to a read command in a high current mode.

In FIG. 9B, the tRCD time may be controlled to have relatively long delay by the timing changing circuit 700 (of FIG. 2) in the low-power mode LP_MODE of the memory device 200 (of FIG. 2). In this case, the timing changing circuit 700 may perform a bit line sensing operation in a low current mode of the memory device 200 (of FIG. 2).

Figure 10:
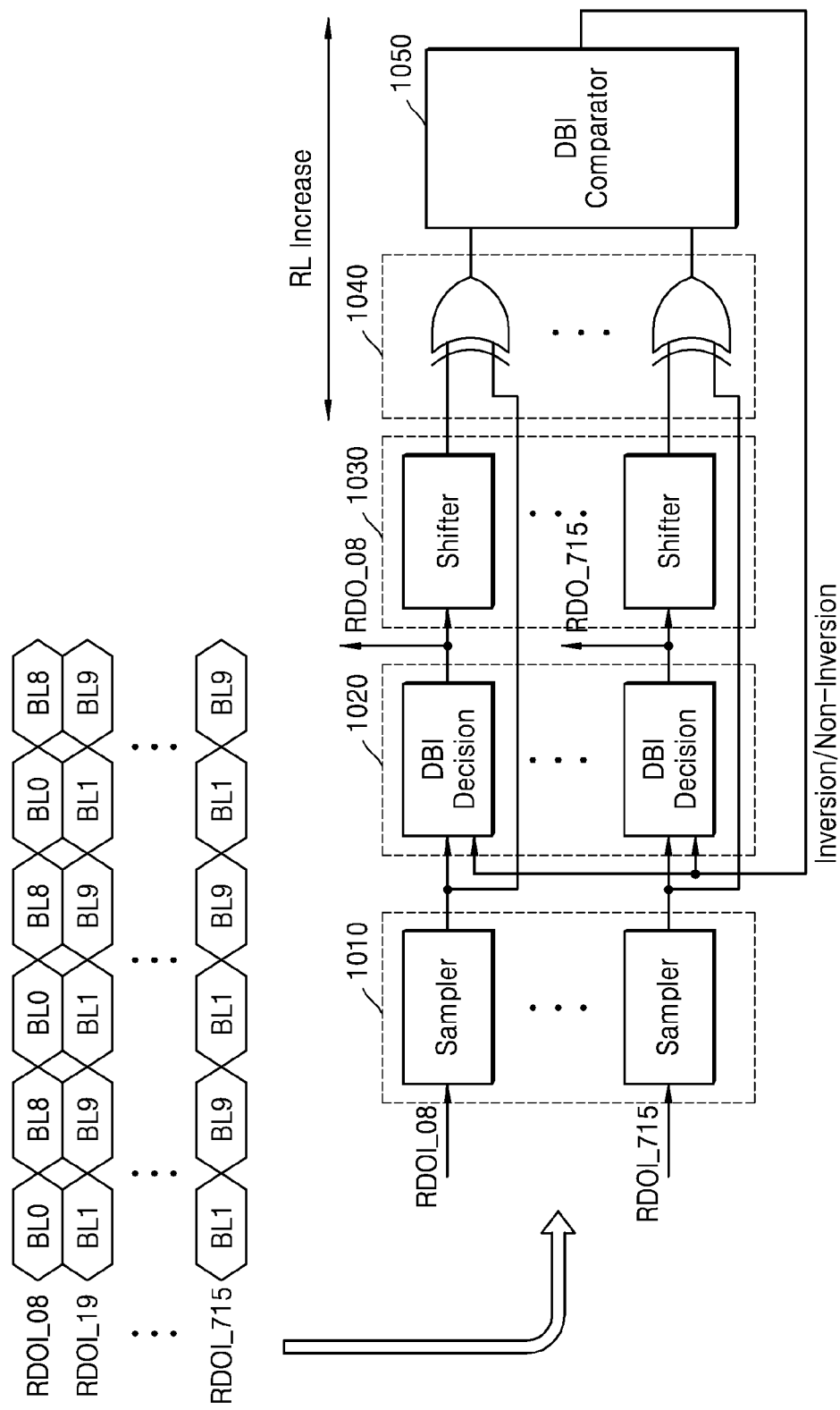
FIG. 10 is an exemplary diagram illustrating an operation of a timing changing circuit of FIG. 2 according to exemplary embodiments.

FIG. 10 is an exemplary diagram illustrating an operation of the timing changing circuit of FIG. 2 according to exemplary embodiments. The timing changing circuit 700 (of FIG. 2) may change a read latency or data toggling on an internal read out path of the memory device 200 (of FIG. 2) according to a power mode (an HP_MODE or an LP_MODE) of the memory device 200 (of FIG. 2).

Referring to FIG. 10, burst data BL0 to BL15 read from the memory device 200 (of FIG. 2) of the memory cell array 210 (of FIG. 2) may be read through internal read out paths RDOI_08, RDOI_19, . . . , and RDOI_715. The internal read out paths RDOI_08 to RDOI_715 may be respectively connected to reading data buses RDO_08 to RDO_715 through a sampler 1010 and a data inversion discriminator 1020. The sampler 1010 may sample data on the internal read out paths RDOI_08 to RDOI_715. The data inversion discriminator 1020 may perform a data toggling operation for inverting or non-inverting an output of the sampler 1010 in response to an inversion/non-inversion signal output from a shift register 1030, a comparator 1040, and a data inversion comparator 1050 serially connected to the reading data buses RDO_08 to RDO_715.

The operation of the timing changing circuit 700 (of FIG. 2) in the low-power mode LP_MODE of the memory device 200 (of FIG. 2) makes an operation speed of the comparator 1040 and the data inversion comparator 1050 become slower resulting in the increase of read latency. According to an exemplary embodiment applied to the memory device 200 (of FIG. 2), the timing changing circuit 700 (of FIG. 2) that operates in the low-power mode LP_MODE may minimize the data inversion-toggling operation by the data inversion discriminator 1020. For example, the timing changing circuit 700 may perform a first data inversion-toggling operation of the data with a first read latency in the high-performance mode and perform a second data inversion-toggling operation a number of times less than a number of times for performing the first data inversion-toggling operation in the low-power mode.

Figure 11:
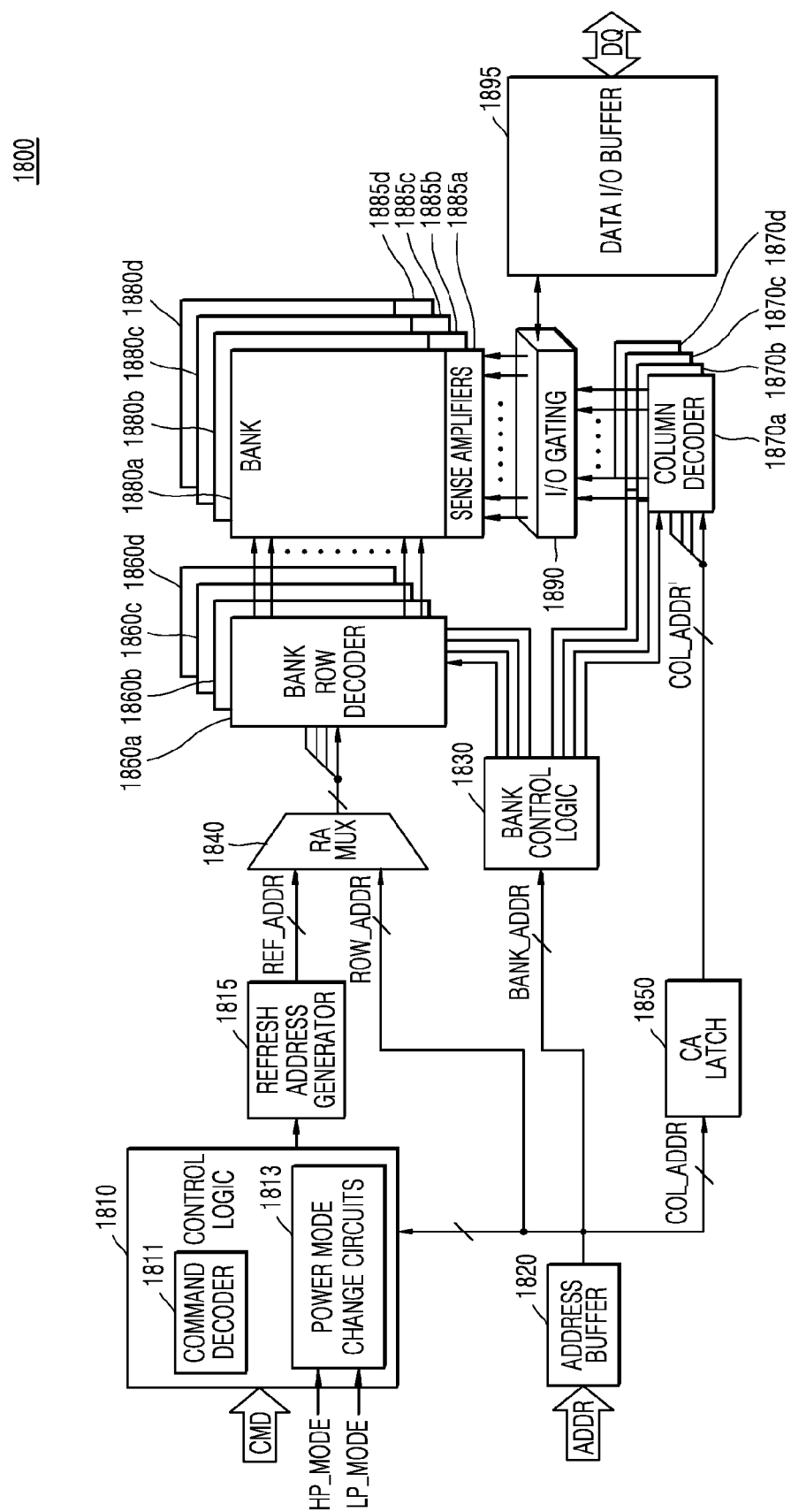
FIG. 11 is an exemplary block diagram of a memory device that may operate in a low power operation mode according to certain embodiments.

FIG. 11 is an exemplary block diagram of a memory device that may operate in a low power operation mode according to certain embodiments.

Referring to FIG. 11, a memory device 1800 may include a control logic 1810, a refresh address generator 1815, an address buffer 1820, a bank control logic 1830, a row address multiplexer 1840, a column address latch 1850, a row decoder, a column decoder, a memory cell array, a sense amplifier, an input/output gating circuit 1890, and a data input/output buffer 1895.

The memory cell array may include first to fourth bank arrays 1880a to 1880d. Each of the first to fourth bank arrays 1880a to 1880d may include a plurality of memory cell rows or pages. The first to fourth bank arrays 1880a to 1880d may further include sense amplifiers 1885a to 1885d for sensing and amplifying memory cells connected to the memory cell rows.

The row decoder may include first to fourth bank row decoders 1860a to 1860d respectively connected to first to fourth bank arrays 1880a to 1880d. The column decoder may include first to fourth bank column decoders 1870a to 1870d respectively connected to first to fourth bank arrays 1880a to 1880d.

The first to fourth bank arrays 1880a to 1880d, the first to fourth bank row decoders 1860a to 1860d, and the first to fourth bank column decoders 1870a to 1870d may respectively from first to fourth memory banks. FIG. 11 illustrates an example of the memory device 1800 including four memory banks; however, the memory device 1800 may include any number of memory banks according to an exemplary embodiment.

Furthermore, according to an exemplary embodiment, the memory device 1800 may be a DRAM such as a double data rate synchronous dynamic random access memory (DDR SDRAM), a low-power double data rate (LPDDR) SDRAM, a graphics double data rate (GDDR) SDRAM, and a Rambus dynamic random access memory (RDRAM).

The control logic 1810 may control an operation of the memory device 1800. For example, the control logic 1810 may generate control signals so that the memory device 1800 may perform a write or read operation. The control logic 1810 may include a command decoder 1811 decoding a command CMD received from a memory controller and power mode changing circuits 1813 that operate in a low power operation mode of the memory device 1800.

The command decoder 1811 may generate control signals corresponding to the command CMD by decoding a write enable signal/WE, a row address strobe signal/RAS, a column address strobe signal/CAS, and a chip select signal/CS. The command CMD may include an active command, a read command, a write command, and a precharge command.

The power mode changing circuits 1813 may include the input/output data type changing circuit 300, the encoding/decoding changing circuit 400, the page size changing circuit 500, the clock path changing circuit 600, and the timing changing circuit 700 described above in FIGS. 3 to 10 and may operate in the low-power mode LP_MODE or the high-performance mode HP_MODE of the memory device 1800. In the low-power mode LP_MODE of the memory device 1800, the power mode changing circuits 1813 do not perform demapping and mapping operations by encoding and decoding changing circuits; change the number of core cycle operations for prefetching data in the memory cell array; reduce a burst length in response to the data prefetched by the core cycle operation; and reduce the number of activated data input/output pins.

The control logic 1810 may further receive differential clocks CLK_t/CLK_b and a clock enable signal CKE to operate the memory device 1800 by a synchronization system. Data of the memory device 1800 may operate at a double data rate. The clock enable signal CKE may be captured at a rising edge of the clock CLK_t.

The control logic 1810 may control the refresh address generator 1815 to perform an auto refresh operation in response to a refresh command or to perform a self refresh operation in response to a self refresh enter command.

The refresh address generator 1815 may generate a refresh address REF_ADDR corresponding to a memory cell row in which a refresh operation is performed. The refresh address generator 1815 may generate the refresh address REF_ADDR by a refresh period defined by standard of a volatile memory device.

The address buffer 1820 may receive an address ADDR including a bank address BANK_ADDR, a row address ROW_ADDR, and a column address COL_ADDR from the memory controller. Furthermore, the address buffer 1820 may provide the received bank address BANK_ADDR to the bank control logic 1830, the received row address ROW_ADDR to the row address multiplexer 1840, and the received column address COL_ADDR to the column address latch 1850.

The bank control logic 1830 may generate bank control signals in response to the bank address BANK_ADDR. One of the first to fourth bank row decoders 1860a to 1860d and one of the first to fourth bank column decoders 1870a to 1870d that correspond to the bank address BANK_ADDR, may be activated in response to bank control signals.

The bank control logic 1830 may generate bank group control signals in response to the bank address BANK_ADDR determining bank groups. Row decoders of a bank group corresponding to the bank address BANK_ADDR from among the first to fourth bank row decoders 1860a to 1860d and column decoders of a bank group corresponding to the bank address BANK_ADDR from among the first to fourth bank column decoders 1870a to 1870d may be activated in response to bank group control signals.

The row address multiplexer 1840 may receive the row address ROW_ADDR from the address buffer 1820 and receive the refresh row address REF_ADDR from the refresh address generator 1815. The row address multiplexer 1840 may selectively output the row address ROW_ADDR or the refresh row address REF_ADDR. A row address output from the row address multiplexer 1840 may be respectively applied to the first to fourth bank row decoders 1860a to 1860d.

A bank row decoder activated by the bank control logic 1830 from among the first to fourth bank row decoders 1860a to 1860d may decode the row address output from the row address multiplexer 1840 and activate a word line corresponding to the row address. For example, the activated bank row decoder may apply a word line driving voltage to the word line corresponding to the row address.

The column address latch 1850 may receive the column address COL_ADDR from the address buffer 1820 and temporarily store the received column address COL_ADDR. The column address latch 1850 may gradually increase the received column address COL_ADDR in a burst mode. The column address latch 1850 may respectively apply the column address COL_ADDR that is temporarily stored or gradually increased to the first to fourth bank column decoders 1870a to 1870d.

A bank column decoder activated by the bank control logic 1830 from among the first to fourth bank column decoders 1870a to 1870d may activate a sense amplifier corresponding to the bank address BANK_ADDR and the column address COL_ADDR through the input/output gating circuit 1890.

The input/output gating circuit 1890 may include an input data mask logic, reading data latches to store data output from the first to fourth bank arrays 1880a to 1880d, and a write driver to write data in the first to fourth bank arrays 1880a to 1880d in addition to circuits gating input/output data.

Write data to be written in a memory cell array of one bank array from among the first to fourth bank arrays 1880a to 1880d may be provided to the data input/output buffer 1895 through a memory buffer from the memory controller. The data provided to the data input/output buffer 1895 may be written in the bank array through the write driver.

Figure 12:
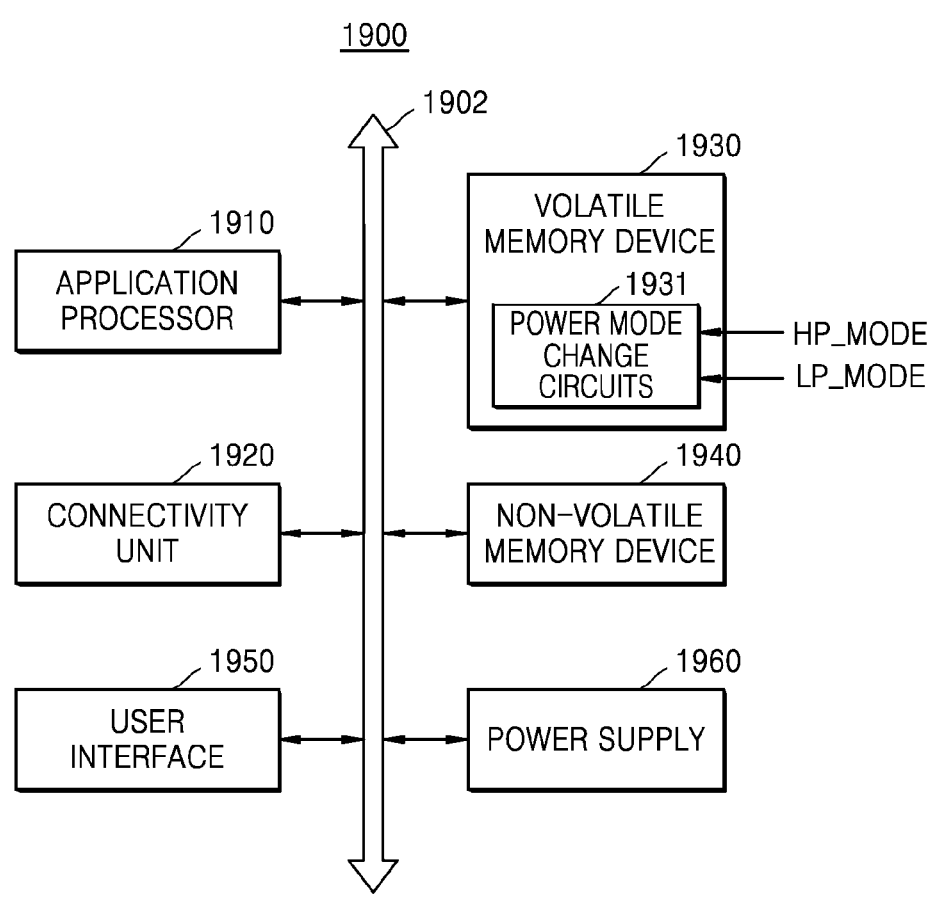
FIG. 12 is an exemplary block diagram of a mobile system including a memory device that may operate in a low power operation mode according to certain embodiments.

FIG. 12 is an exemplary block diagram of a mobile system including a memory device that may operate in a low power operation mode according to certain embodiments.

Referring to FIG. 12, a mobile system 1900 may include an application processor 1910, a connectivity unit 1920, a first memory device 1930, a second memory device 1940, a user interface 1950, and a power supply 1960 that are connected to each other through a bus 1902. The first memory device 1930 may be a volatile memory device and the second memory device 1940 may be a non-volatile memory device. According to an exemplary embodiment, the mobile system 1900 may be a mobile system such as a mobile phone, a smart phone, a personal digital assistant (PDA), a portable multimedia player (PMP), a digital camera, a music player, a portable game console, or a navigation system.

The application processor 1910 may perform applications providing an Internet browser, a game, or a moving image. According to an exemplary embodiment, the application processor 1910 may include a single core or a multi-core. For example, the application processor 1910 may include a dual-core, a quad-core, or a hexa-core. Furthermore, according to an exemplary embodiment, the application processor 1910 may further include a cache memory located inside or outside thereof.

The connectivity unit 1920 may perform wireless communication or wire communication with an external device. For example, the connectivity unit 1920 may perform Ethernet communication, near field communication (NFC), radio frequency identification (RFID) communication, mobile telecommunication, memory card communication, or universal serial bus (USB) communication. For example, the connectivity unit 1920 may include a baseband chipset and may support communication such as GSM, GRPS, WCDMA, or HSxPA.

The first memory device 1930, which may be a volatile memory device, may store data processed by the application processor 1910 as write data or may be operated as a working memory. The first memory device 1930 may include power mode changing circuits 1931 that operate in a low power operation mode of the first memory device 1930. The power mode changing circuits 1931 may include the input/output data type changing circuit 300, the encoding/decoding changing circuit 400, the page size changing circuit 500, the clock path changing circuit 600, or the timing changing circuit 700 described in FIGS. 3 to 10, which operate in a low-power mode LP_MODE or a high-performance mode HP_MODE of the first memory device 1930. The first memory device 1930 may not perform demapping and mapping operations according to the encoding and decoding changing circuit, may change the number of core cycle operations for prefetching data in a memory cell array, may reduce a burst length in response to the data prefetched by the core cycle operation, and may reduce the number of activated data input/output pins, in the low-power mode LP_MODE.

The second memory device 1940, which is a non-volatile memory device, may store a boot image for booting of the mobile system 1900. For example, the non-volatile memory device 1940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The user interface 1950 may include at least one input device such as a keypad or a touch screen and/or at least one output device such as a speaker or a display device. The power supply 1960 may supply an operating voltage. Furthermore, according to an exemplary embodiment, the mobile system 1900 may include camera image processors (CIPS), and may further include a storage device such as memory cards, solid state drives (SSDs), hard disk drives (HDDs), or CD-ROMs.

Figure 13:
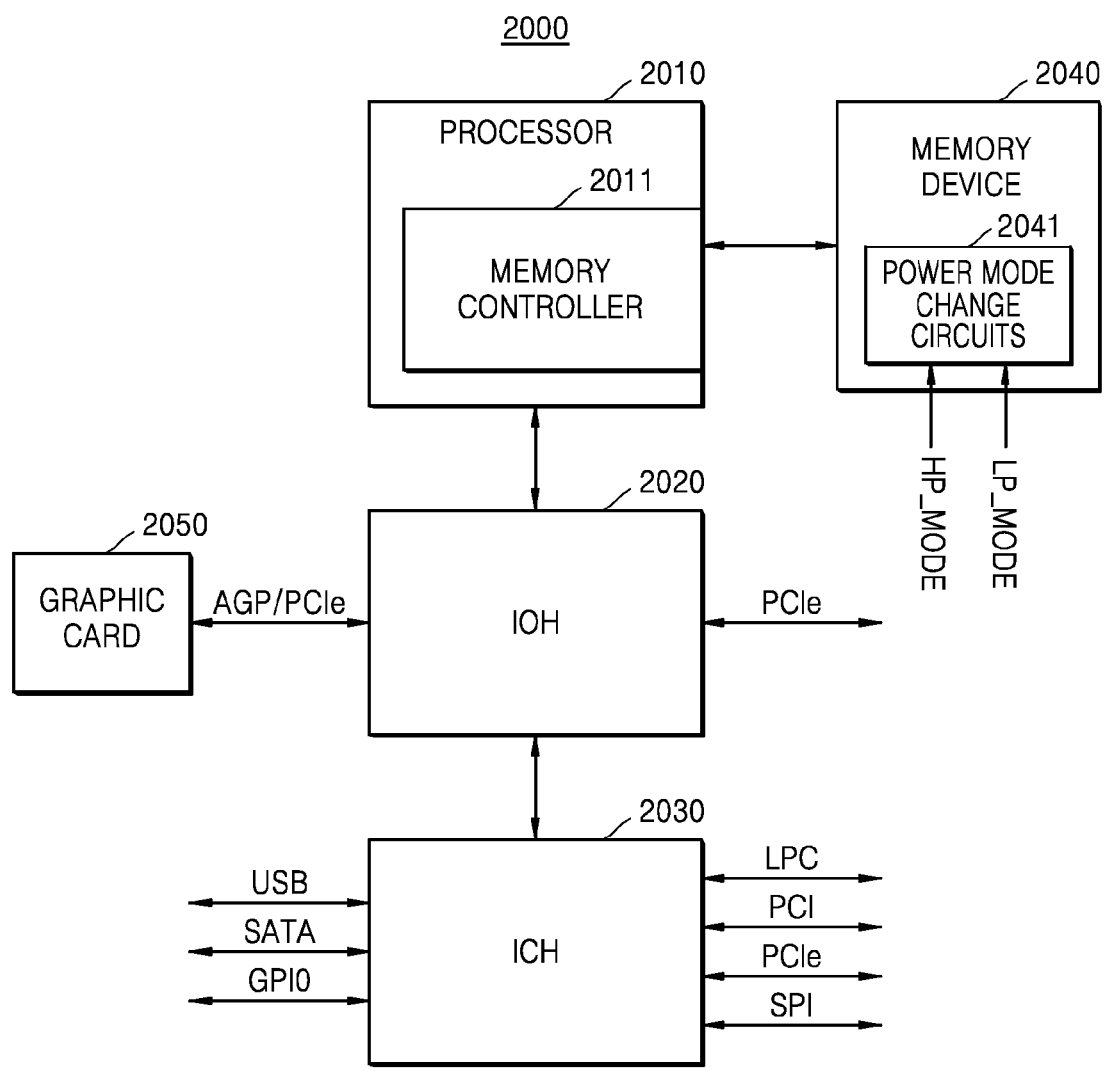
FIG. 13 is an exemplary block diagram of a computing system including a memory device that may operate in a low power operation mode according to certain embodiments.

FIG. 13 is an exemplary block diagram of a computing system including a memory device that may operate in a low power operation mode according to certain embodiments.

Referring to FIG. 13, a computer system 2000 may include a processor 2010, an input/output hub 2020, an input/output controller hub 2030, a memory device 2040, and a graphic card 2050. According to an exemplary embodiment, the computer system 2000 may be a computing system such as a personal computer (PC), a server computer, a Workstation, a laptop, a mobile phone, a smart phone, a personal information terminal (PDA), a portable multimedia player (PMP), a digital camera, a digital television, a set-top box, a music player, a portable game console, or a navigation system.

The processor 2010 may perform various computing functions such as specific calculations or tasks. For example, the processor 2010 may be a micro processor or a central processing unit (CPU). According to an exemplary embodiment, the processor 2010 may include a single core or a multi-core. For example, the processor 2010 may include a dual core, a quad-core, or a hexa core. Furthermore, the computer system 2000 may include a plurality of processors. Furthermore, according to an exemplary embodiment, the processor 2010 may further include a cache memory located inside or outside thereof.

The processor 2010 may include a memory controller 2011 controlling an operation of the memory device 2040. The memory controller 2011 included in the processor 2010 may be referred to as an integrated memory controller (IMC). According to an exemplary embodiment, the memory controller 2011 may be located in the input/output hub 2020. The input/output hub 2020, including the memory controller 2011, may be referred to as a memory controller hub (MCH).

The memory device 2040 may include power mode changing circuits 2041 that may operate in a low power operation mode of the memory device 2040. The power mode changing circuits 2041 may include the input/output data type changing circuit 300, the encoding/decoding changing circuit 400, the page size changing circuit 500, the clock path changing circuit 600, or the timing changing circuit 700 described in FIGS. 3 to 10, which operate in a low-power mode LP_MODE or a high-performance mode HP_MODE of the memory device 2040. The memory device 2040 may not perform demapping and mapping operations according to the encoding and decoding changing circuit, may change the number of core cycle operations for prefetching data in a memory cell array, may reduce a burst length in response to the data prefetched by the core cycle operation, and may reduce the number of activated data input/output pins, in the low-power mode LP_MODE of the memory device 2040.

The input/output hub 2020 may manage a data transmission between devices such as the graphic card 2050 and the processor 2010. The input/output hub 2020 may be connected to the processor 2010 through various types of interfaces. For example, the input/output hub 2020 and the processor 2010 may be connected through various standards of interfaces such as a front side bus (FSB), a system bus, HyperTransport, a lighting data transport (LDT), QuickPath Interconnect (QPI), a common system interface, or a peripheral component interface-express (PCIe). FIG. 13 illustrates the computer system 2000 including the input/output hub 2020, however, according to an exemplary embodiment, the computer system 2000 may include a plurality of input/output hubs.

The input/output hub 2020 may provide a variety of interfaces with regard to various devices. For example, the input/output hub 2020 may provide an accelerated graphics port (AGP) interface, a PCIe, or a communications streaming architecture (CSA) interface.

The graphic card 2050 may be connected to the input/output hub 2020 through an AGP interface or a PCIe. The graphic card 2050 may control a display device (not shown) to display an image. The graphic card 2050 may include an internal processor to process image data and an internal semiconductor memory device. According to an exemplary embodiment, the input/output hub 2020 may include a graphic device in the input/output hub 2020 with or instead of the graphic card 2050 located outside of the input/output hub 2020. The graphic device included in the input/output hub 2020 may be referred to as integrated graphics. Furthermore, the input/output hub 2020 including the memory controller and the graphic device may be referred to as a graphics and memory controller hub (GMCH).

The input/output controller hub 2030 may perform data buffering and interface arbitration in order to efficiently operate various system interfaces. The input/output controller hub 2030 may be connected to the input/output hub 2020 through an internal bus. For example, the input/output hub 2020 and the input/output controller hub 2030 may be connected to each other through a direct media interface (DMI), a hub interface, an enterprise southbridge interface (ESI), or a PCIe.

The input/output controller hub 2030 may provide a variety of interfaces between peripheral devices. For example, the input/output controller hub 2030 may provide a universal serial bus (USB) port, a serial advanced technology attachment (SATA) port, a general purpose input/output (GPIO), a low pin count (LPC) bus, a serial peripheral interface (SPI), a PCI, or a PCIe.

According to an exemplary embodiment, two or more components from among the processor 2010, the input/output hub 2020, and the input/output controller hub 2030 may be realized as one chip-set.

While the disclosure has been particularly shown and described with reference to exemplary embodiments thereof, it will be understood that various changes in form and details may be made therein without departing from the spirit and scope of the following claims.

What is claimed is:

1. A memory device comprising:
a memory cell array;
input/output data type changing circuits comprising a decoding circuit and an encoding circuit, the decoding circuit is configured to decode a data symbol inputted from an external device into internal data bits for writing into the memory cell array and the encoding circuit configured to encode data bits read from the memory cell array into a data symbol; and
data pins configured to communicate with the external device and the input/output data type changing circuits,
wherein:
the data type changing circuits operate in different types of data transmission methods in accordance with a memory device operation power mode, and
the decoding circuit comprises:
a de-map block configured to decode the data symbol, which is inputted from the external device, and output the internal data bits for writing into the memory cell array in a high-performance mode of the memory device but not in a low-performance mode of the memory device; and
a deserializer configured to transmit outputs of comparators, comparing data applied to the data pins with a reference voltage, to the memory cell array serially or in parallel in the low-performance mode of the memory device.

2. The memory device of claim 1, wherein the encoding circuit comprises a map block configured to encode the data bits read from the memory cell array and convert the data bits into the data symbol in the high-performance mode of the memory device.

3. The memory device of claim 1, wherein:
the input/output data type changing circuits receive the data symbol, which is applied to the data pins, in the high-performance mode of the memory device, and
the input/output data type changing circuits further comprising:
output buffers configured to transmit data applied to the data pins;
a terminator configured to terminate respective outputs of the output buffers in multi-levels; and
input buffers configured to output the data symbol in response to the outputs of the terminated output buffers.

4. The memory device of claim 1, wherein the deserializer is further configured to compare the data applied to the data pins and at least one data mask pin with the reference voltage and to transmit the compared data through the deserializer to the memory cell array.

5. The memory device of claim 1, wherein:
the input/output data type changing circuits receive single data applied to the data pins in the low-performance mode of the memory device, and
the input/output changing circuit comprises:
output buffers configured to output the single data to the data pins; and
input buffers configured to compare each component of the single data with the reference voltage.

6. The memory device of claim 1, further comprising a clock path changing circuit configured to transmit an internal clock signal, generated based on a clock signal received through a clock buffer, to high-performance tree circuits operating based on a current mode logic in the high-performance mode of the memory device and transmit the internal clock signal to low-performance tree circuits, operated at a complementary metal-oxide-semiconductor (CMOS) level, in the low-performance mode of the memory device.

7. The memory device of claim 1, further comprising a timing changing circuit configured to set a tRCD time between a row activation command and a read command applied to the memory device as a first time period in the high-performance mode of the memory device and to set the tRCD time as a second time period longer than the first time period in the low-performance mode of the memory device.

8. The memory device of claim 7, wherein the timing changing circuit is further configured to perform a sensing operation for sensing data read from the memory cell array by a first current in the high-performance mode of the memory device, and further configured to perform the sensing operation by a second current less than the first current in the low-performance mode of the memory device.

9. The memory device of claim 1, further comprising a timing changing circuit configured to output data read from the memory cell array with a first read latency in the high-performance mode of the memory device and output data read from the memory cell array with a second read latency longer than the first read latency in the low-performance mode of the memory device.

10. The memory device of claim 9, wherein the timing changing circuit is further configured to perform a first data inversion-toggling operation on a read out path of the data with the first read latency in the high-performance mode of the memory device, and to perform a second data inversion-toggling operation a number of times less than a number of times for performing the first data inversion-toggling operation in the low-performance mode of the memory device.

11. A memory device comprising:
a memory cell array; and
a page size changing circuit configured to change a size of data prefetched in the memory cell array according to a power mode of the memory device, wherein:
the size of data prefetched in a high-performance mode is larger than a size of data prefetched in a low-power mode, and
the size of the data prefetched in the memory cell array for each of the high-performance mode of the memory device and the low-power mode of the memory device is a non-zero size,
wherein the page size changing circuit is further configured to:
prefetch data corresponding to a first burst length from the memory cell array by one core cycle operation for prefetching data from the memory cell array in the high-performance mode of the memory device, and
prefetch data of a second burst length, less than the burst length corresponding to the first burst length, from the memory cell array by the one core cycle operation in the low-power mode of the memory device.

12. The memory device of claim 11, wherein the page size changing circuit is further configured to:
prefetch data from the memory cell array by one core cycle operation for prefetching data from the memory cell array in the high-performance mode of the memory device, and
prefetch data from the memory cell array by at least two core cycle operations in the low-power mode of the memory device.

13. The memory device of claim 11, further comprising:
first and second data lines connected to the memory cell array, wherein:

the page size changing circuit is further configured to:
  read out data prefetched from the memory cell array through the first and second data lines in the high-performance mode of the memory device; and
  selectively activate the first data line or the second data line and read out data prefetched from the memory cell array through the activated first data line or second data line in the low-power mode of the memory device.

14. A memory device comprising:
a memory cell array; and
a page size changing circuit configured to change the number of data items prefetched in the memory cell array according to a power mode during a read operation, wherein the number of data items prefetched in the memory cell array during the read operation is a non-zero number; and
an encoding and decoding circuit configured to change a level of data written in the memory cell array according to the power mode during a writing operation, wherein the level of data written in the memory cell array during the writing operation number is a non-zero level,
wherein the page size changing circuit prefetches data corresponding to a first burst length from the memory cell array when the memory device is in a high-performance mode, and prefetches data corresponding to a second burst length, smaller than the first burst length, from the memory cell array when the memory device is in a low-power mode.

15. The memory device of claim 14, wherein, with respect to the encoding and decoding circuit, the level of the data written in the memory cell array is multi-levels when the memory device is in a high-performance mode, and the data is written in the memory cell array with a single-ended method when the memory device is in a low-power mode.

16. The memory device of claim 14, further comprising a timing changing circuit configured to operate a sensing operation sensing data read from the memory cell array by a first current when the memory device is in a high-performance mode and operate the sensing operation by a second current, less than the first current, when the memory device is in a low-power mode.

17. The memory device of claim 14, further comprising a timing changing circuit configured to output data read from the memory cell array with a first read latency when the memory device is in a high-performance mode and configured to output data read from the memory cell array with a second read latency, longer than the first read latency, when the memory device is in a low-power mode.

* * * * *